United States Patent
Levermore et al.

(10) Patent No.: US 9,397,312 B2
(45) Date of Patent: Jul. 19, 2016

(54) PROCESS FOR FABRICATING METAL BUS LINES FOR OLED LIGHTING PANELS

(71) Applicant: Universal Display Corporation, Ewing, NJ (US)

(72) Inventors: Peter Levermore, Lambertville, NJ (US); Huiqing Pang, Newtown, PA (US); Emory Krall, Philadelphia, PA (US); Rajan Kamala, Newtown, PA (US); Ruiqing Ma, Morristown, NJ (US); Paul E. Burrows, Chattaroy, WA (US)

(73) Assignee: Universal Display Corporation, Ewing, NJ (US)

( * ) Notice: Subject to any disclaimer, the term of this patent is extended or adjusted under 35 U.S.C. 154(b) by 71 days.

(21) Appl. No.: 13/788,321

(22) Filed: Mar. 7, 2013

(65) Prior Publication Data

US 2014/0091282 A1   Apr. 3, 2014

Related U.S. Application Data

(62) Division of application No. 13/105,770, filed on May 11, 2011, now Pat. No. 8,432,095.

(51) Int. Cl.
*H01L 51/00* (2006.01)
*H01L 51/52* (2006.01)
(Continued)

(52) U.S. Cl.
CPC .......... *H01L 51/5203* (2013.01); *C23C 14/042* (2013.01); *C23C 14/24* (2013.01);
(Continued)

(58) Field of Classification Search
CPC ..... H01L 51/5203; H01L 51/56; H01L 51/50; H01L 51/5212; H01L 2251/5392; H01L 2251/5361
See application file for complete search history.

(56) References Cited

U.S. PATENT DOCUMENTS

| | | |
|---|---|---|
| 4,469,719 A | 9/1984 | Martin |
| 4,769,292 A | 9/1988 | Tang et al. |

(Continued)

FOREIGN PATENT DOCUMENTS

| | | |
|---|---|---|
| EP | 0650955 | 5/1995 |
| EP | 1331666 | 7/2003 |

(Continued)

OTHER PUBLICATIONS

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," *Adv. Mater.*, 6(9):677-679 (1994).

(Continued)

*Primary Examiner* — Anne Hines
(74) *Attorney, Agent, or Firm* — Morris & Kamlay LLP

(57) ABSTRACT

Systems and methods for the design and fabrication of OLEDs, including high-performance large-area OLEDs, are provided. Variously described fabrication processes may be used to deposit and pattern bus lines with a smooth profile and a gradual sidewall transition. Such smooth profiles may, for example, reduce the probability of electrical shorting at the bus lines. Accordingly, in certain circumstances, an insulating layer may no longer be considered essential, and may be optionally avoided altogether. In cases where an insulating layer is not used, further enhancements in the emissive area and shelf life of the device may be achieved as well. According to aspects of the invention, bus lines such as those described herein may be deposited, and patterned, using vapor deposition such as vacuum thermal evaporation (VTE) through a shadow mask, and may avoid multiple photolithography steps. Other vapor deposition systems and methods may include, among others, sputter deposition, e-beam evaporation and chemical vapor deposition (CVD). A final profile of the bus line may substantially correspond to the profile as deposited.

25 Claims, 21 Drawing Sheets

(51) Int. Cl.
*H01L 51/50* (2006.01)
*H01L 51/56* (2006.01)
*H05B 33/10* (2006.01)
*C23C 14/04* (2006.01)
*C23C 14/24* (2006.01)
*H01L 27/32* (2006.01)

(52) U.S. Cl.
CPC ............ *H01L 51/50* (2013.01); *H01L 51/5212* (2013.01); *H01L 51/5228* (2013.01); *H01L 51/56* (2013.01); *H05B 33/10* (2013.01); *H01L 27/3202* (2013.01); *H01L 27/3204* (2013.01); *H01L 27/329* (2013.01); *H01L 27/3279* (2013.01); *H01L 51/0023* (2013.01); *H01L 51/0097* (2013.01); *H01L 51/5016* (2013.01); *H01L 2251/5338* (2013.01); *H01L 2251/5361* (2013.01); *H01L 2251/5392* (2013.01)

(56) References Cited

U.S. PATENT DOCUMENTS

| | | | |
|---|---|---|---|
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,403,392 | B1 | 6/2002 | Burrows et al. |
| 6,468,819 | B1 | 10/2002 | Kim et al. |
| 6,528,187 | B1 | 3/2003 | Okada |
| 6,626,721 | B1 | 9/2003 | Van Slyke et al. |
| 6,687,266 | B1 | 2/2004 | Ma et al. |
| 6,835,469 | B2 | 12/2004 | Kwong et al. |
| 6,891,327 | B2 * | 5/2005 | Duineveld et al. ............ 313/505 |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 7,576,496 | B2 | 8/2009 | Duggal et al. |
| 8,120,248 | B2 | 2/2012 | Shinto et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0006697 | A1 | 1/2003 | Weaver |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2004/0253756 | A1 | 12/2004 | Cok et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0061724 | A1 | 3/2009 | Cok et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0146557 | A1 | 6/2009 | Shinto et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |

FOREIGN PATENT DOCUMENTS

| | | |
|---|---|---|
| EP | 1725079 | 11/2006 |
| EP | 2034538 | 3/2009 |
| JP | 200511610 | 1/2005 |
| JP | 2006147190 A | 6/2006 |
| JP | 2006147190 | 8/2006 |
| JP | 2007123392 | 5/2007 |
| JP | 2007254297 | 10/2007 |
| JP | 2008074939 | 10/2009 |
| JP | 2010080310 | 8/2010 |
| KR | 20090116551 | 11/2009 |
| TW | I278255 B | 4/2007 |
| TW | I300996 B | 9/2008 |
| WO | WO 0139234 | 5/2001 |
| WO | WO 0202714 | 1/2002 |
| WO | WO 0215645 | 2/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005019373 | 3/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006072002 | 7/2006 |
| WO | WO 2006082742 | 8/2006 |
| WO | WO 2006098120 | 9/2006 |
| WO | WO 2006100298 | 9/2006 |
| WO | WO 2006103874 | 10/2006 |
| WO | WO 2006114966 | 11/2006 |
| WO | WO 2006132173 | 12/2006 |
| WO | WO 2007002683 | 1/2007 |
| WO | WO 2007004380 | 1/2007 |
| WO | WO 2007063754 | 6/2007 |
| WO | WO 2007063796 | 6/2007 |
| WO | WO 2008056746 | 5/2008 |
| WO | WO 2008101842 | 8/2008 |
| WO | WO 2008132085 | 11/2008 |
| WO | WO 2009000673 | 12/2008 |
| WO | WO 2009003898 | 1/2009 |
| WO | WO 2009008311 | 1/2009 |
| WO | WO 2009018009 | 2/2009 |
| WO | WO 2009050290 | 4/2009 |

(56) References Cited

FOREIGN PATENT DOCUMENTS

| | | |
|---|---|---|
| WO | WO 2009021126 | 5/2009 |
| WO | WO 2009062578 | 5/2009 |
| WO | WO 2009063833 | 5/2009 |
| WO | WO 2009066778 | 5/2009 |
| WO | WO 2009066779 | 5/2009 |
| WO | WO 2009086028 | 7/2009 |
| WO | WO 2009100991 | 8/2009 |
| WO | WO 2010/038181 | 4/2010 |

OTHER PUBLICATIONS

Paulose, Betty Marie Jennifer S. et al., "First Examples of Alkenyl Pyridines as Organic Ligands for Phosphorescent Iridium Complexes," *Adv. Mater.*, 16(22):2003-2007 (2004).

Tung, Yung-Liang et al., "Organic Light-Emitting Diodes Based on Charge-Neutral Ru$^{II}$ PHosphorescent Emitters," *Adv. Mater.*, 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).

Wong, Wai-Yeung, "Multifunctional Iridium Complexes Based on Carbazole Modules as Highly Efficient Electrophosphors," *Angew. Chem. Int. Ed.*, 45:7800-7803 (2006).

Tang, C.W. and VanSlyke, S.A., "Organic Electroluminescent Diodes," *Appl. Phys. Lett.*, 51(12):913-915 (1987).

Adachi, Chihaya et al., "Organic Electroluminescent Device Having a Hole Conductor as an Emitting Layer," *Appl. Phys. Lett.*, 55(15):1489-1491 (1989).

Ma, Yuguang et al., "Triplet Luminescent Dinuclear-Gold(/) Complex-Based Light-Emitting Diodes with Low Turn-On voltage," *Appl. Phys. Lett*, 74(10):1361-1363 (1999).

Gao, Zhiqiang et al., "Bright-Blue Electroluminescence From a Silyl-Substituted ter-(phenylene-vinylene) derivative," *Appl. Phys. Lett.*, 74(6):865-867 (1999).

Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Hung, L.S. et al., "Anode Modification in Organic Light-Emitting Diodes by Low-Frequency Plasma Polymerization of CHF$_3$,"*Appl. Phys. Lett.*, 78(5):673-675 (2001).

Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).

Wang, Y. et al., "Highly Efficient Electroluminescent Materials Based on Fluorinated Organometallic Iridium Compounds," *Appl. Phys. Lett.*, 79(4):449-451 (2001).

Kwong, Raymond C. et al., "High Operational Stability of Electrophosphorescent Devices," *Appl. Phys. Lett.*, 81(1):162-164 (2002).

Holmes, R.J. et al., "Blue Organic Electrophosphorescence Using Exothermic Host-Guest Energy Transfer," *Appl. Phys. Lett.*, 82(15):2422-2424 (2003).

Sotoyama, Wataru et al., "Efficient Organic Light-Emitting Diodes with Phosphorescent Platinum Complexes Containing N$^\wedge$ C$^\wedge$ N-Coordinating Tridentate Ligand," *Appl. Phys. Lett.*, 86:153505-1-153505-3 (2005).

Okumoto, Kenji et al., "Green Fluorescent Organic Light-Emitting Device with External Quantum Efficiency of Nearly 10%," *Appl. Phys. Lett.*, 89:063504-1-063504-3 (2006).

Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).

Aonuma, Masaki et al., "Material Design of Hole Transport Materials Capable of Thick-Film Formation in Organic Light Emitting Diodes," *Appl. Phys. Lett.*, 90:183503-1-183503-3 (2007).

Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).

Adachi, Chihaya et al., "High-Efficiency Red Electrophosphorescence Devices," *Appl. Phys. Lett.*, 78(11):1622-1624 (2001).

Wong, Keith Man-Chung et al., A Novel Class of Phosphorescent Gold(III) Alkynyl-Based Organic Light-Emitting Devices with Tunable Colour, *Chem. Commun.*, 2906-2908 (2005).

Hamada, Yuji et al., "High Luminance in Organic Electroluminescent Devices with Bis(10-hydroxybenzo[h]quinolinato)beryllium as an Emitter," *Chem. Lett.*, 905-906 (1993).

Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).

Mi, Bao-Xiu et al., "Thermally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Niu, Yu-Hua et al., "Highly Efficient Electrophosphorescent Devices with Saturated Red Emission from a Neutral Osmium Complex," *Chem. Mater.*, 17(13):3532-3536 (2005).

Lo, Shih-Chun et al., "Blue Phosphorescence from Iridium(III) Complexes at Room Temperature," *Chem. Mater.*, 18(21):5119-5129 (2006).

Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).

Lamansky, Sergey et al., "Synthesis and Characterization of Phosphorescent Cyclometalated Iridium Complexes," *Inorg. Chem.*, 40(7):1704-1711 (2001).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Noda, Tetsuya and Shirota,Yasuhiko, "5,5'-Bis(dimesitylboryl)-2,2'-bithiophene and 5,5''-Bis(dimesitylboryl)-2,2':5',2''-terthiophene as a Novel Family of Electron-Transporting Amorphous Molecular Materials," *J. Am. Chem. Soc.*, 120 (37):9714-9715 (1998).

Sakamoto, Youichi et al., "Synthesis, Characterization, and Electron-Transport Property of Perfluorinated Phenylene Dendrimers," *J. Am. Chem. Soc.*, 122(8):1832-1833 (2000).

Adachi, Chihaya et al., "Nearly 100% Internal Phosphorescence Efficiency in an Organic Light Emitting Device," *J. Appl. Phys.*, 90(10):5048-5051 (2001).

Shirota, Yasuhiko et al., "Starburst Molecules Based on π-Electron Systems as Materials for Organic Electroluminescent Devices," *Journal of Luminescence*, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kido, Junji et al., 1,2,4-Triazole Derivative as an Electron Transport Layer in Organic Electroluminescent Devices, *Jpn. J. Appl. Phys.*, 32:L917-L920 (1993).

Van Slyke, S. A. et al., "Organic Electroluminescent Devices with Improved Stability," *Appl. Phys. Lett.*, 69(15 ):2160-2162 (1996).

Guo, Tzung-Fang et al., "Highly Efficient Electrophosphorescent Polymer Light-Emitting Devices," *Organic Electronics*, 1:15-20 (2000).

Palilis, Leonidas C., "High Efficiency Molecular Organic Light-Emitting Diodes Based on Silole Derivatives and Their Exciplexes," *Organic Electronics*, 4:113-121 (2003).

Ikeda, Hisao et al., "P-185: Low-Drive-Voltage OLEDs with a Buffer Layer Having Molybdenum Oxide," *SID Symposium Digest*, 37:923-926 (2006).

(56) References Cited

OTHER PUBLICATIONS

T. Östergärd et al., "Langmuir-Blodgett Light-Emitting Diodes of Poly(3-Hexylthiophene): Electro-Optical Characteristics Related to Structure," *Synthetic Metals*, 87:171-177 (1997).

Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).

Salbeck, J. et al., "Low Molecular Organic Glasses for Blue Electroluminescence," *Synthetic Metals*, 91:209-215 (1997).

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 3, 4-6 (1999).

International Search Report received in PCT/US2012/037378 application.

Taiwan OA for TW 101116731, mailed Mar. 30, 2016.

* cited by examiner

PROCESS FOR FABRICATING METAL BUS LINES FOR OLED LIGHTING PANELS

This application is a continuation of U.S. patent application Ser. No. 13/105,770, filed May 11, 2011, the disclosure of which is herein expressly incorporated by reference in its entirety.

FIELD OF THE INVENTION

The present invention relates to systems and processes for fabricating OLED lighting panels, and particularly for forming metal bus lines as may be used in large-area OLED lighting panels.

The claimed invention was made by, on behalf of, and/or in connection with one or more of the following parties to a joint university corporation research agreement: Regents of the University of Michigan, Princeton University the University of Southern California, and the Universal Display Corporation. The agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

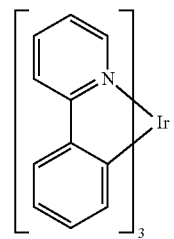

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

In a typical bottom-emission OLED device, the anode material is conventionally a transparent conducting oxide (TCO), which generates power losses and Joule heating due to its relatively high resistivity and thin film thickness. For example, sheet resistance is typically in the range of 10-100 Ohm/square for a thickness range of 50-200 nm. This is in contrast to metal, which is often used for the reflective cathode. This can result in brightness non-uniformity, which becomes more evident when scaling up to large-area light panels. In order to improve uniformity, highly-conductive metal bus lines may be deposited in electrical contact with the TCO electrode to provide improved current distribution across the panel. Bus lines can help distribute current more evenly across the entire panel with very little power loss. A similar approach may be applied to top-emission OLED devices, where a semi-transparent cathode is required. In this instance, uniformity may be improved by depositing highly conductive metal bus lines in electrical contact with the cathode. In a transparent OLED device, highly conductive metal bus lines may be deposited in electrical contact with both electrodes.

The conventional way to pattern metal bus lines is through photolithography followed by a lift-off process. Many published materials have taught that an insulating layer (such as $SiO_2$ or a photo-resist) is required to cover the bus lines to prevent shorting. U.S. Patent Application Pub. No. US 2003/0006697 by Weaver discloses such a device including a first electrode, an insulating strip disposed over a portion of the first electrode, and a bus line disposed on top of the insulating strip, such that the bus line is electrically insulated from the first electrode by the insulating strip. International Patent Application Pub. No. WO 2010/038181 A1 by Schwab et al. ("Schwab") also describes an OLED device where bus (shunt) lines are applied to an electrode. Schwab goes on to describe how passivation (electrical insulation) at least partially and preferably totally covering the bus lines is required to prevent electrical shorting to an opposing electrode. In fact, it has become a standard practice in the industry to use an insulating layer (e.g., $SiO_2$, SiN, polyimide etc.) to cover the bus lines to prevent electrical shorts occurring between the bus lines and the opposing electrode.

However, introducing an insulating layer, or grid, such as those described in the foregoing publications, can reduce the emissive area since the area covered by the insulating material is non-emissive. In addition, shelf life of the OLED may be reduced if moisture is stored in the insulating layer. Finally, bus lines and the insulating layer are typically patterned using photolithography, which is time-consuming and expensive.

SUMMARY OF THE INVENTION

According to aspects of the invention, systems, and methods for the design and fabrication of OLEDs, including high-performance large-area OLEDs, are provided. In embodiments, fabrication processes may be used to deposit and pattern bus lines with a smooth profile and a gradual sidewall transition. Such smooth profiles and gradual sidewall transitions have been found by the inventors to, for example, reduce the probability of electrical shorting at the bus lines. Accordingly, in certain embodiments, an insulating layer may no longer be considered essential, and may be optionally avoided altogether. In cases where an insulating layer is not used, further enhancements in the emissive area and shelf life of the device may be achieved as well. As discussed further herein, by depositing and patterning bus lines according to the described methods, improvements in the luminance uniformity of large-area OLED light panels may also be achieved.

In embodiments, bus lines such as those described herein may be deposited, and patterned, using vapor deposition such as vacuum thermal evaporation (VTE) through a shadow mask, which may simplify the fabrication process by eliminating, for example, multiple photolithography steps. Other vapor deposition systems and methods may include, among others, sputter deposition, e-beam evaporation and chemical vapor deposition (CVD).

According to first aspects of the invention, a method of manufacturing a light emitting panel with a plurality of bus lines may include forming a first electrode layer and forming an organic layer stack over the first electrode layer. A second electrode layer may be formed over the organic layer stack. Embodiments may include patterning a plurality of bus lines by vapor deposition through a shadow mask on at least one of the first electrode layer, the second electrode layer, or such other layers that may allow the bus lines to be electrically connected to the first electrode layer and/or the second electrode layer. In embodiments, the plurality of bus lines may be in electrical contact with at least one of the first electrode layer and the second electrode layer. For example, an electrical contact may be formed by depositing the bus lines on an electrode layer and/or depositing an electrode layer on the bus lines.

In embodiments, the plurality of bus lines may be in electrical contact with the first electrode layer and the first electrode layer may be deposited before the plurality of bus lines. In embodiments, the plurality of bus lines may be in electrical contact with the first electrode layer and the plurality of bus lines may be deposited before first electrode layer. In embodiments, the plurality of bus lines may be in electrical contact with the second electrode layer and the second electrode layer may be deposited before the plurality of bus lines. In embodiments, the plurality of bus lines may be in electrical contact with the second electrode layer and the plurality of bus lines may be deposited before the second electrode layer. In embodiments, a first set of the plurality of bus lines may be in electrical contact with the first electrode layer and a second set of the plurality of bus lines may be in electrical contact with the second electrode layer.

In embodiments, a final profile shape of the bus lines may substantially correspond to a profile shape of the bus lines as deposited. In embodiments, the patterning of the plurality of bus lines may include at least one of vacuum thermal evaporation (VTE) deposition, sputter deposition, e-beam evaporation and chemical vapor deposition (CVD). For example, the patterning of the plurality of bus lines may include deposition by VTE through the shadow mask.

In embodiments, the patterning of the plurality of bus lines may include at least one of (a) selecting a thickness of the shadow mask; (b) selecting a position of a material source with respect to the shadow mask; and (c) controlling the gap between the substrate and the shadow mask based on the desired final profile shape of the bus lines. In embodiments, the thickness of the shadow mask may be in a range of approximately 20 microns to 500 microns. In embodiments, the angle between the line connecting source and center of the substrate and the normal line of the substrate may be in a range of approximately 0° to 200.

In embodiments, the organic layer stack may be grown on the bus lines without an interceding insulator. In alternative embodiments, an insulator may be formed between the organic layer stack and the bus lines. The insulator may be formed between organic layer stack and the bus lines without breaking vacuum. The final profile of the insulating layer may correspond to the profile of the insulating layer as formed.

In embodiments, the forming of the first electrode layer, the patterning of the bus lines, the forming of the organic layer stack, and/or the forming of the second electrode layer may be performed without wet processing.

In embodiments, a slope angle of a sidewall of the bus line may be in a range of, for example, 0.010-30°, the slope angle measured based on a line between two points on the bus line sidewall at 10% and 90% respectively of bus line thickness. In embodiments, the maximum absolute value of the second derivative of the sidewall profile of the bus line layer with respect to distance along the substrate surface may be, for example, <1.0. A root-mean-square (RMS) value of surface roughness of the bus line layer along the sidewall may be, for example, <30 nm.

In embodiments, an electrode layer may be formed before the bus lines are patterned. In other embodiments, the bus lines may be patterned before an electrode layer is formed. In embodiments, an anode may be formed between the organic stacks and a substrate. In embodiments, a cathode may be formed between the organic stacks and a substrate. In embodiments, an electrode layer may be formed on both sides of the bus lines.

According to further aspects of the invention, a light emitting panel device may include a first electrode layer and a plurality of bus lines patterned by vapor deposition. In embodiments, the light emitting panel may also include an organic layer stack over the first electrode layer and the bus lines, and a second electrode layer over the organic layer stack. In embodiments, the plurality of bus lines may include a final profile shape substantially as deposited.

In embodiments, the organic layer stack of the device may be on the bus lines without an interceding insulator. In alternative embodiments, the device may include an insulator between the organic layer stack and the bus lines. The insulator may be formed between organic layer stack and the bus lines without breaking vacuum. The final profile of the insulating layer may correspond to the profile of the insulating layer as formed.

In embodiments, a slope angle of a sidewall of the bus line layer of the device may be in a range of 0.01-30°. In embodiments, the maximum absolute value of the second derivative of the sidewall profile of the bus line layer of the device with respect to distance along the substrate surface may be <1.0. In embodiments, a root-mean-square (RMS) of surface roughness of the bus line layer along the sidewall may be <30 nm According to further aspects of the invention, another light emitting panel device may include a first electrode layer and a plurality of bus lines, with an organic layer stack over the first electrode layer and the bus lines. A second electrode layer may be included over the organic layer stack. In embodiments, the plurality of bus lines may include a final profile shape having sidewall angles in a range approximately between 0.01°-30°. The organic layer stack may be, for example, on the bus lines without an interceding insulator. Embodiments may include an insulator between the organic layer stack and the bus lines.

In embodiments, the sidewall angle may be measured based on a line between two points on the bus line slope at 10% and 90% respectively of bus line thickness.

In embodiments, the final profile shape may have sidewall angles, for example, in a range approximately between 0.01°-20°, or between 0.01°-10°, or between 0.01°-1°.

In embodiments, the maximum absolute value of the second derivative of the sidewall of the bus line layer with respect to distance along the substrate surface may be <1.0, and/or an RMS surface roughness of the bus line layer along the sidewall may be <30 nm.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings.

DETAILED DESCRIPTION

Figure 1:
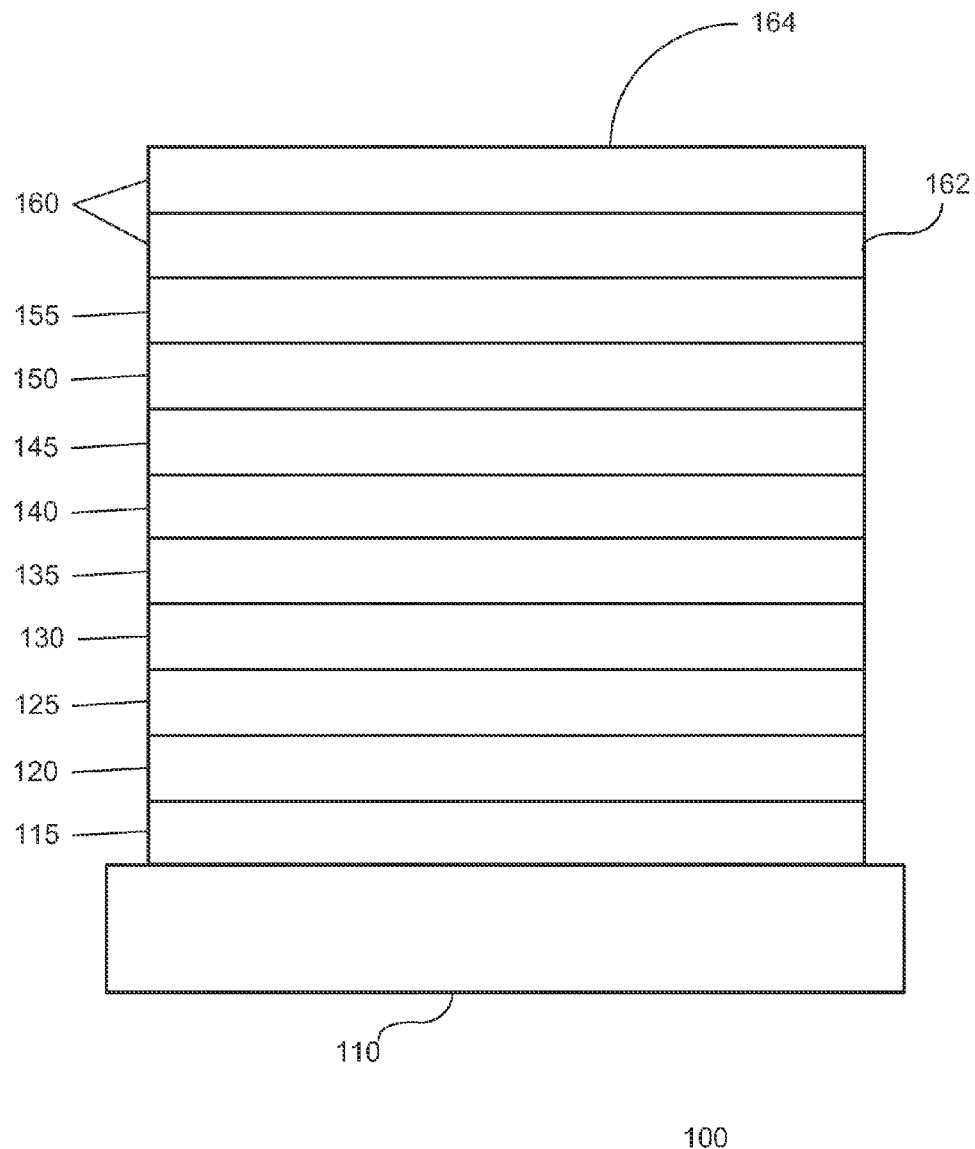
FIG. 1 shows an organic light emitting device.

It is understood that the invention is not limited to the particular methodology, protocols, and reagents, etc., described herein, as these may vary as the skilled artisan will recognize. It is also to be understood that the terminology used herein is used for the purpose of describing particular embodiments only, and is not intended to limit the scope of the invention. It also is be noted that as used herein and in the appended claims, the singular forms "a," "an," and "the" include the plural reference unless the context clearly dictates otherwise. Thus, for example, a reference to "a bus line" is a reference to one or more bus lines and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

The following preferred embodiments may be described in the context of exemplary OLED devices for ease of description and understanding. However, the invention is not limited to the specifically described devices and methods, and may be adapted to various circuit assemblies without departing from the overall scope of the invention. For example, devices and related methods including concepts described herein may be used for the assembly of microchips, optoelectronic devices, such as solar cells and photodetectors, and other apparatus with multi-layer circuitry.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-1") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
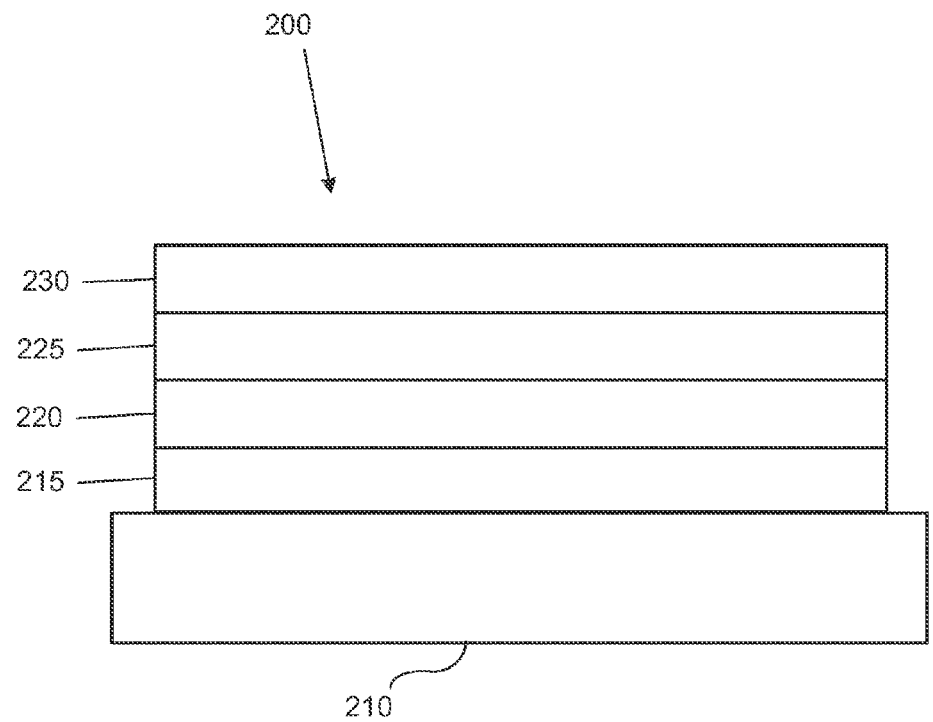
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Fonest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As mentioned previously, the conventional method to form bus lines is photolithography patterning, followed by a lift-off step. Aspects of the present invention, and comparisons to other known fabrication techniques and devices are discussed further with respect to FIG. 3, which depicts a OLED panel 300, with emissive areas 310 and bus lines 320.

According to aspects of the invention an alternative means of depositing and patterning metal bus lines using, for example, vacuum thermal evaporation through a shadow mask has been developed. Such processes have been shown to be, in general, simpler and less expensive than photolithography. Moreover, according to further aspects of the invention, wet processes may be avoided, which can serve to reduce the amount of moisture that is retained in the device so as to extend the device shelf lifetime. As discussed further herein, the inventors have demonstrated, for example, a large area OLED light panel with a device layer structure including a first electrode, bus lines, a second electrode and an emissive layer, in which the metal bus lines may be patterned through VTE, and the like, followed by direct deposition of the organic layers. An increased emissive area can be achieved due to the elimination of non-emissive insulating layer which is conventionally deposited on to metal bus lines to prevent shorting. This can lead to increased total light output for a given luminance, which in turn improved device lifetime and efficiency.

Figure 3:
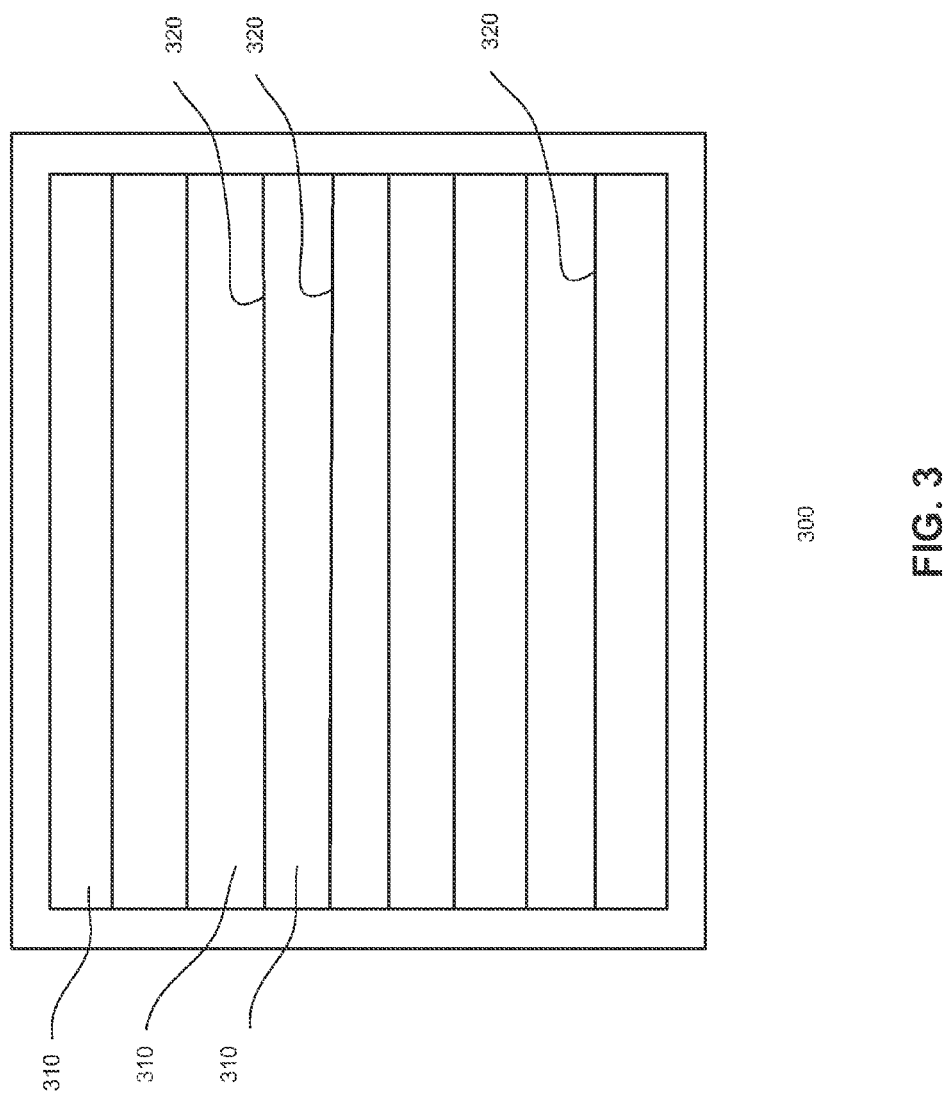
FIG. 3 shows an exemplary large-area OLED light panel with metal bus lines.
Figure 4:
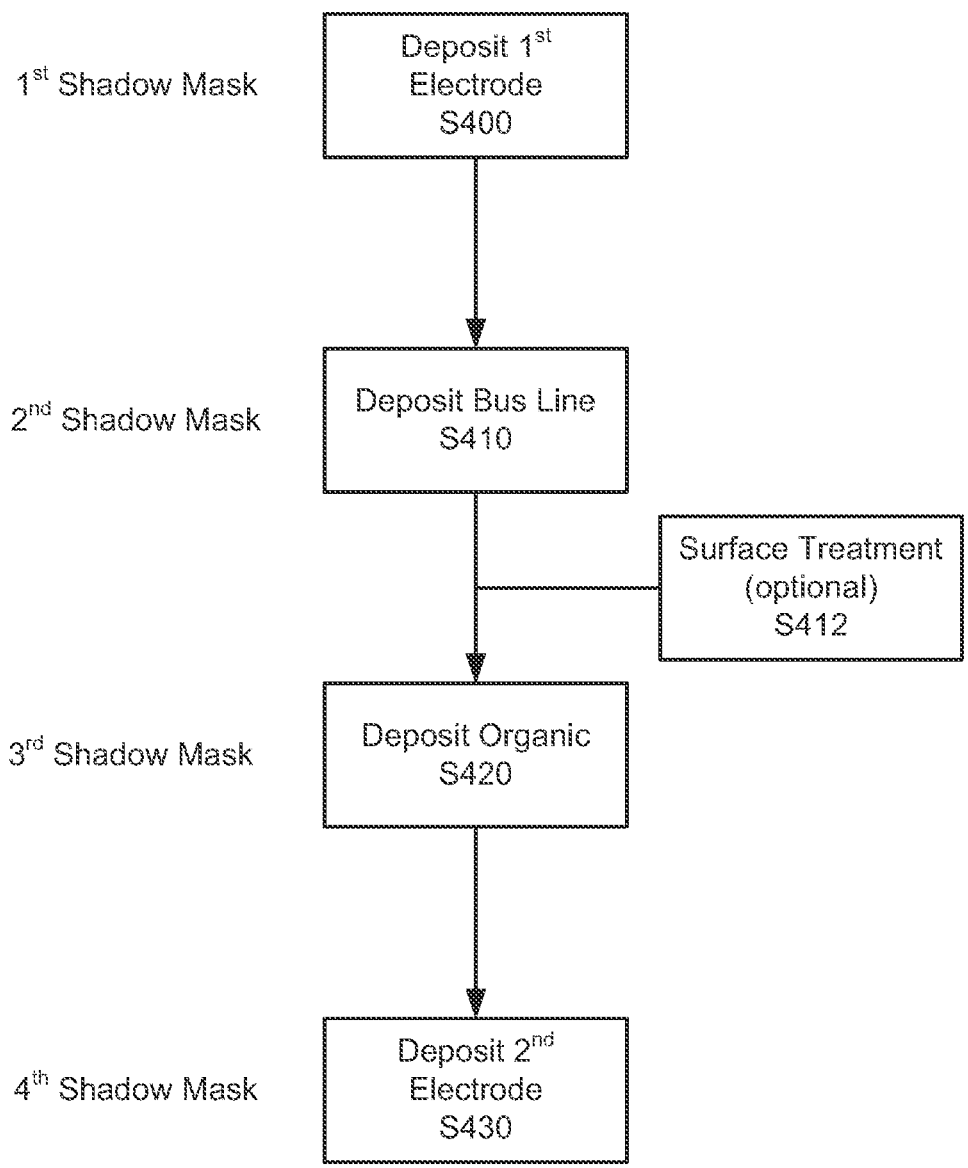
FIG. 4 shows an exemplary process for forming OLED devices according to aspects of the invention.

For example, a process of manufacturing an OLED lighting panel including bus lines, such as those generally depicted in FIG. 3, may include steps shown in FIG. 4. The method may begin with S400 in which a first electrode may be deposited. The first electrode may be an anode. In other embodiments, the first electrode may be a cathode. In embodiments, the first electrode may be deposited through a first shadow mask. The method may continue with S410.

In S410, a plurality of bus lines may be patterned by vapor deposition through a second shadow mask. In embodiments, the patterning of the plurality of bus lines may include at least one of vacuum thermal evaporation (VTE) deposition, sputter deposition, e-beam evaporation and chemical vapor deposition (CVD), or other similar techniques known in the art. For example, the patterning of the plurality of bus lines may include deposition by VTE through the shadow mask. As discussed further below, such patterning may result in a desirable profile of the bus lines without, for example, further patterning steps. That is, a final profile shape of the bus lines may substantially correspond, or directly correspond, to a profile shape of the bus lines as they were deposited in S410.

It is noted that FIG. 4 depicts a manufacturing process where the first electrode is deposited before the bus lines. In an alternative process, the bus lines may be deposited before the first electrode, e.g. the bus lines may be deposited on a substrate and the first electrode formed on the bus lines and substrate. Such methods may be beneficial, for example, in providing a flat interface, without bus lines, between a first electrode layer and an organic stack formed over the first electrode layer. The method may continue with optional step S412.

In S412 a surface treatment, or other process, may be applied to form an insulating layer over the bus lines deposited in S410. The insulating layer can provide insulation between the metal bus lines and the organic layers to further prevent shorting. The insulating layer can also prevent charge injection from the metal bus lines into the organic layers. In embodiments, such insulating layers, when present, may have a relatively thin profile compared to those formed in conventional techniques owing, for example, to the improved performance of the gradually sloped bus lines. An example of forming an insulating layer in S412 may include exposing an Al bus line surface to oxygen to form an aluminum oxide layer. A further example may include VTE deposition through a shadow mask of insulating material such as $SiO_2$ or SiN over the bus lines. The thickness of the insulating materials may be, for example, <1000 Å. In embodiments, such steps may be performed without breaking vacuum, which may help increase throughput and/or improve device lifetime. In embodiments, the final profile shape of the insulating layer may correspond to a profile shape of the insulating layer as deposited. The method may continue with S420.

In S420, one or more organic layers, e.g. an organic layer stack, may be grown over, and/or on, the bus lines and first electrode, or, if an insulating layer was formed in optional S412, the organic layer(s) may be grown over, and/or on, the insulating layer and first electrode. The organic layer may be deposited through a third shadow mask, or via other techniques known in the art. The method may continue with S430.

In S430, a second electrode may be deposited over the organic layer. The second electrode may be a cathode. In other embodiments, the second electrode may be an anode. The second electrode may be formed, for example, using a fourth shadow mask. Accordingly, and as described further herein, an OLED stack including at least a first electrode, a plurality of bus lines, an organic layer and a second electrode may be manufactured without any wet processing steps. FIG. 4 shows a process flow wherein the first electrode is deposited before the organic layers and before the second electrode. In an alternative embodiment, the second electrode is deposited before the organic layers and before the first electrode, wherein the bus lines are in electrical contact with the first electrode. In an alternative embodiment, separate bus lines are in electrical contact with both the first and second electrodes. Aspects of an exemplary bus line profile are shown in FIG. 5.

Figure 5:
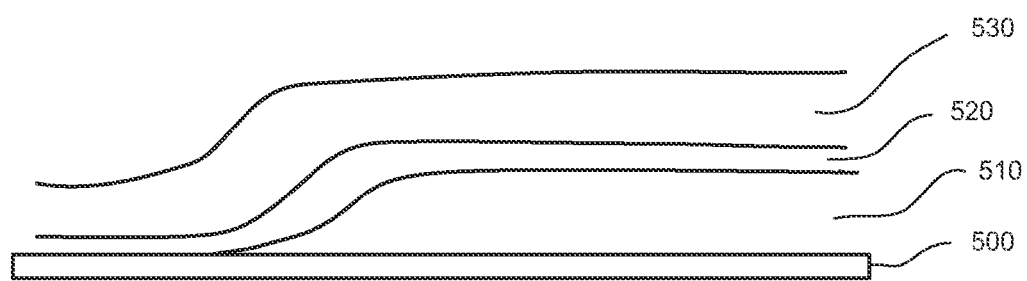
FIG. 5 shows an exemplary cross section illustration of a panel structure, where organic materials of the OLED stack are disposed directly onto the bus lines and anode.

As shown in FIG. 5, a bus line 510 deposited over an a first electrode 500 according to aspects of the invention may include a relatively gradual slope, without sharp corners. In the embodiment shown in FIG. 5, an organic layer 520 is disposed on the bus line 510, and a second electrode 530 is disposed over the organic layer 520. The bus line 510 may be an evaporated metal. Additional details of exemplary bus line 510 are shown in FIG. 6.

A slope angle Θ of a sidewall of the bus line 510 may preferably be in a range of, for example, 0.01°-30°. The slope angle θ may represent an angle that is measured based on a line L between two points on the bus line sidewall at 10% and 90% respectively of bus line thickness T. In embodiments, the maximum absolute value of the second derivative of the sidewall of the bus line layer with respect to distance along the substrate surface may be, for example, <1.0.

It should be noted that organic layer 520 may be deposited directly on the bus line 510, or, optionally, there may be an insulating layer formed between the organic layer and the bus line. Alternative arrangements, such as the relative positions of the electrodes with respect to the bus lines, are also possible depending, for example, on the desired operation of the device.

Figure 6:
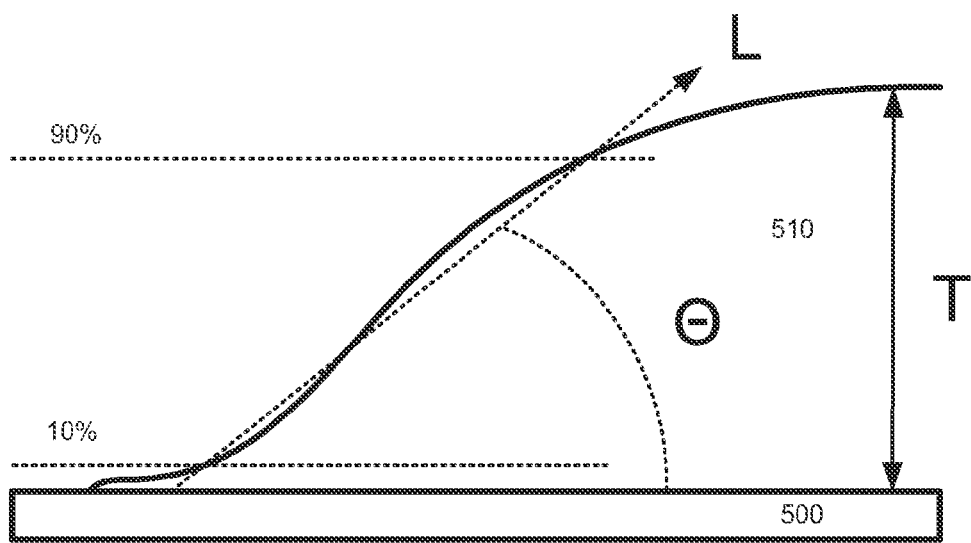
FIG. 6 shows further details of a bus line profile according to aspects of the invention.
Figure 7:
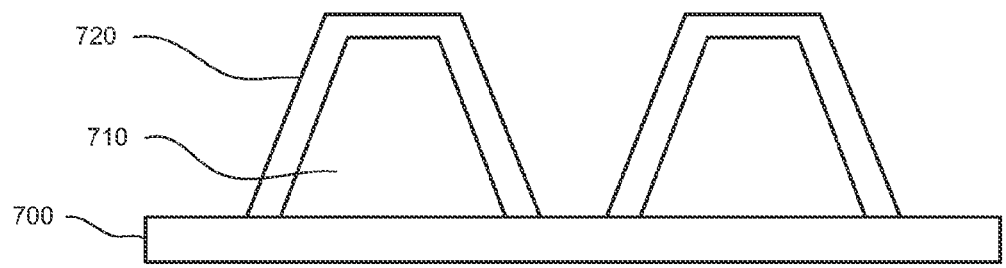
FIG. 7 shows a related art OLED device structure including passivation (insulating layer) on top of metal bus lines.

The profiles shown in FIGS. 5 and 6 may be contrasted with a related art device as shown in FIG. 7. As shown in FIG. 7, a device including metal bus lines 710 over an ITO 700 may be formed by techniques including lithography steps to pattern the metal bus lines 710. At least partly because of the sharp corners and/or relatively steep angle of the sidewalls, which induce strong local electric fields and can potentially cause electrical shorting, a passivation (insulating) layer 720 is required on such devices to avoid short circuits between the bus lines 710 and the OLED cathode (not shown).

Figure 8:
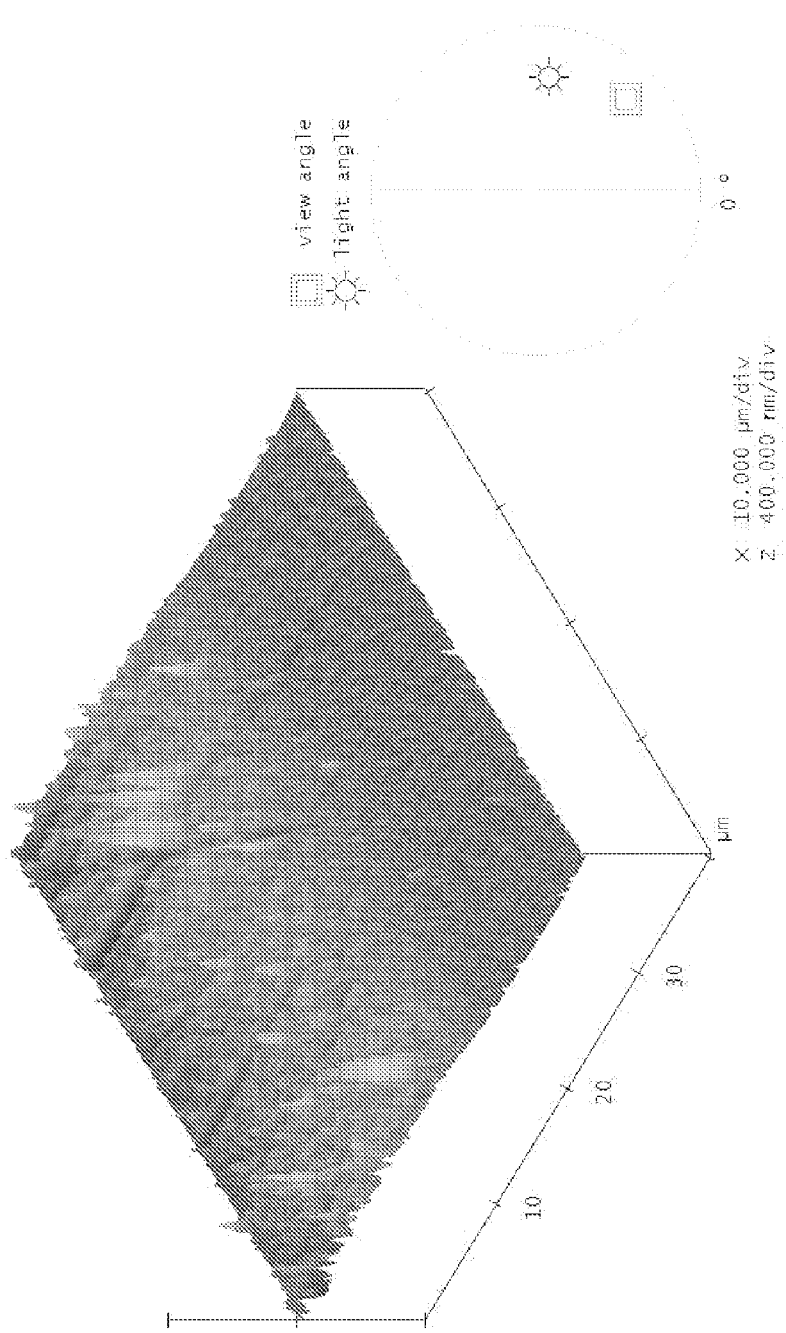
FIG. 8 shows a 3D AFM image of the slope of a bus line deposited by VTE through a shadow mask.
Figure 9:
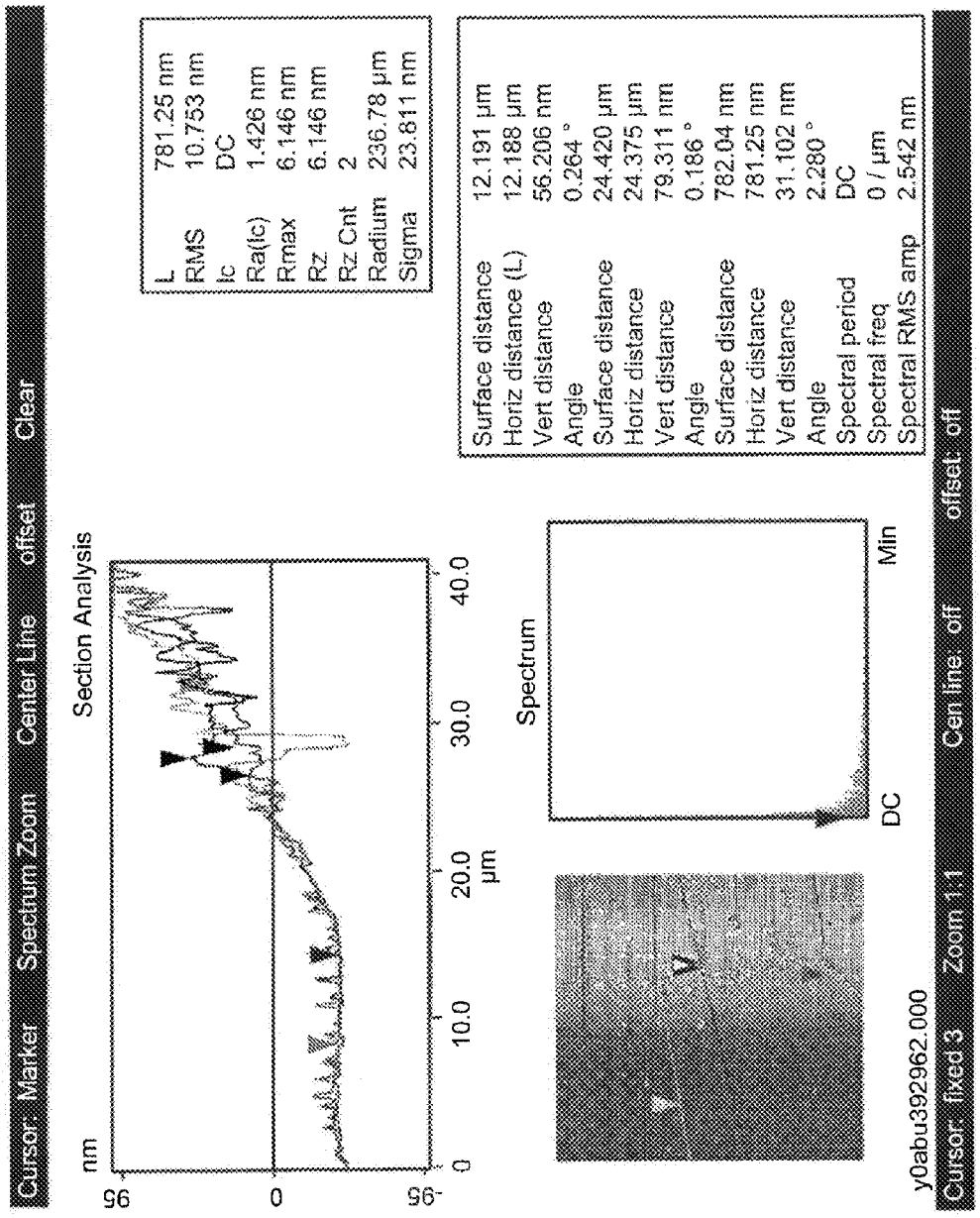
FIG. 9 shows data regarding the RMS of the VTE slope.

A 3D atomic force microscope (AFM) image of the sidewall of an exemplary bus line formed by the inventors by VTE is shown in FIG. 8. Detailed data in FIG. 9 shows that the root-mean-square (RMS) roughness value of the slope is around 11 nm, and the black cursor measures the height of the small peak to be about 31 nm. In embodiments, an RMS surface roughness of the bus line layer along the sidewall may be, for example, approximately, 30 nm or less. Bus lines deposited in this manner may also prove more secure against electrical shorting, compared to other bus lines discussed further herein, owing to a gradual sidewall profile, smooth surface and reduced number of defects.

Such bus line features may allow for OLED devices to be formed by simply growing the OLED structure over the bus lines without a further insulating layer, or with a relatively thin and/or low-resistivity insulating layer compared to known devices. For example, the insulating layer may be required only to prevent charge injection from the bus lines, rather than to prevent electrical shorting.

Returning to FIG. 4, it has been demonstrated by the inventors that the foregoing processes may be performed as an all-vacuum process that could be used to fabricate an OLED light panel. For example, an anode (such as ITO or IZO) may be sputtered through a shadow mask. Then bus lines may be disposed onto the anode as described herein. The organic layers may then be deposited, for example, by VTE through a shadow mask, followed by the cathode through a separate shadow mask. Finally, thin film encapsulation could also be applied in vacuum. Alternatively, a substrate with an electrode and bus lines and optional insulating layer could be fabricated completely in vacuum (e.g. steps S400-S410 or S412 in FIG. 4), and this could then be used to fabricate an OLED lighting panel using any available means.

Figure 10A:
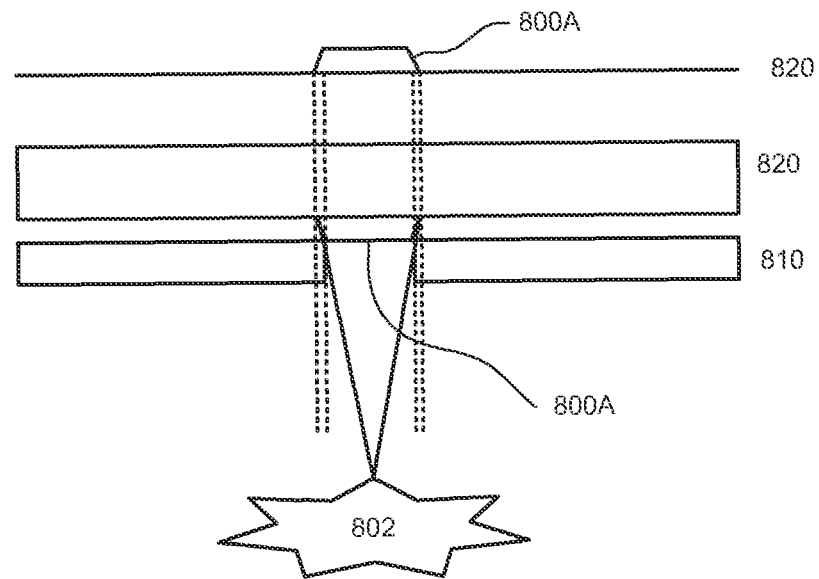
FIGS. 10A-10C show various aspects of changes in source location and mask thickness according to aspects of the invention.

The inventors have further noted that the gradual sidewall profile of metal bus lines deposited through a shadow mask is benefited from a feathering effect during vapor deposition. Owing to a small gap between the mask 810 and the substrate 820, as illustrated in FIG. 10A, which may be caused due to thermal expansion, rotation or weight of the mask, additional materials may be deposited onto the substrate beyond the mask opening. For example, if the gap is 100 μm, and the angle between the edge of mask opening with respect to the center of source material is 10°, additional material will be deposited about 500 μm beyond the mask opening. If the target thickness of the material is 200 nm, very mild slope of the sidewall may be formed with an angle of only 0.02°. Alternatively, if the gap is less than 100 μm, less material may be deposited beyond the mask opening and therefore a steeper slope may be expected. The gap between the mask and substrate is dependent on factors such as mask thickness, mask material, substrate material, deposition temperature etc.

Figure 10B:
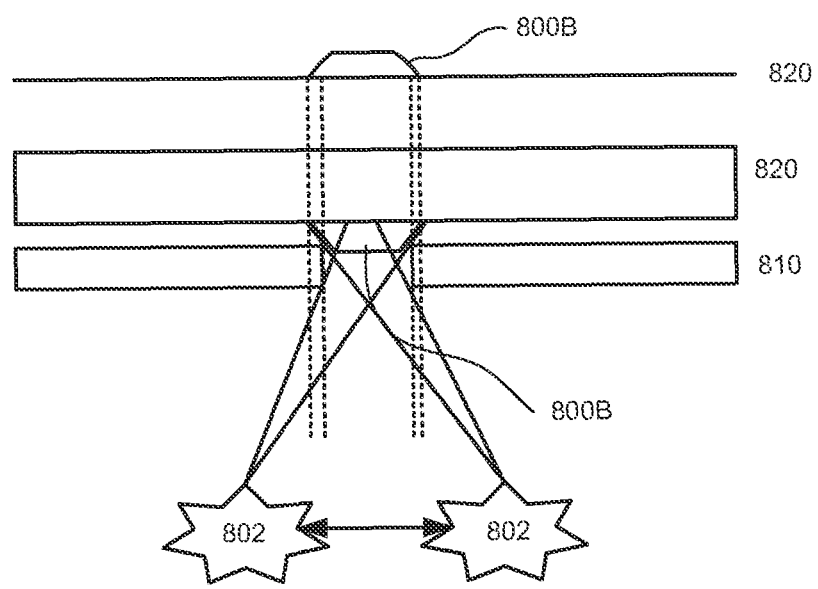
Figure 10C:
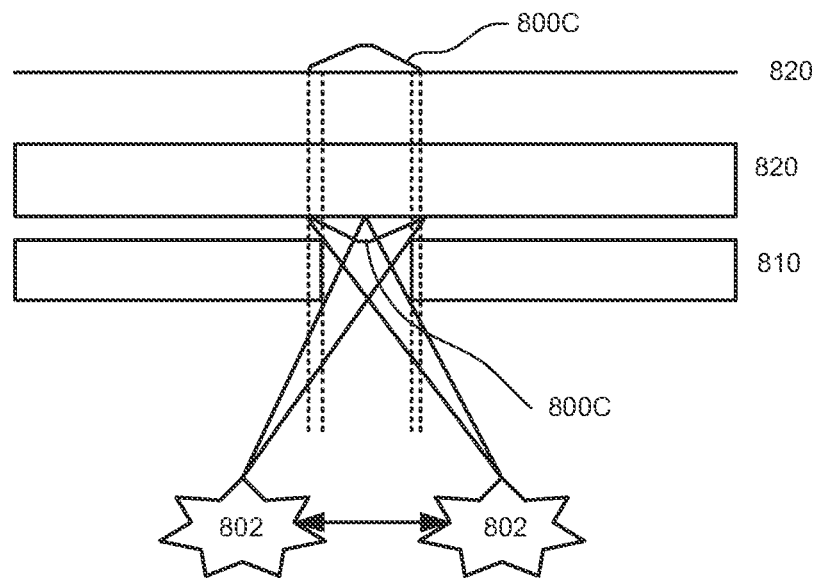

In addition, the inventors have found that the sidewall profile of the VTE deposited bus lines (or other layers) may be controlled by properly positioning the source material in combination with certain mask thickness, as can be seen in FIGS. 10A-10C. For example, a sharper profile of VTE deposited bus line 800A is illustrated in FIG. 10A, where the source material 802 is positioned at the center, and the bus line 800A is deposited through shadow mask 810 onto a substrate 820. The top portions of FIGS. 10A-10C provide an unobstructed view of the bus line as deposited for clarity.

If the source 802 is positioned at an angle away from the center, the profile may be altered to look like that in FIG. 10B, with a slope at both edges. FIG. 10B shows the source material 802 in different positions. This is for illustration purposes only. In a manufacturing environment, relative changes in deposition angle would most likely be achieved by rotating the substrate, while the source material remains fixed.

If the thickness of the mask 810 increases as shown in FIG. 10C, a more gradual transition of the bus line 800C can be achieved. Accordingly, the patterning of the plurality of bus lines may include at least one of (a) selecting a thickness of the shadow mask, (b) selecting a position of a material source with respect to the shadow mask and (c) controlling the gap between the shadow mask and the substrate based on the desired final profile shape of the bus lines. In this regard, the inventors have found that a thickness of the shadow mask may preferably be in a range of approximately 20 microns to 500 microns.

Figure 11:
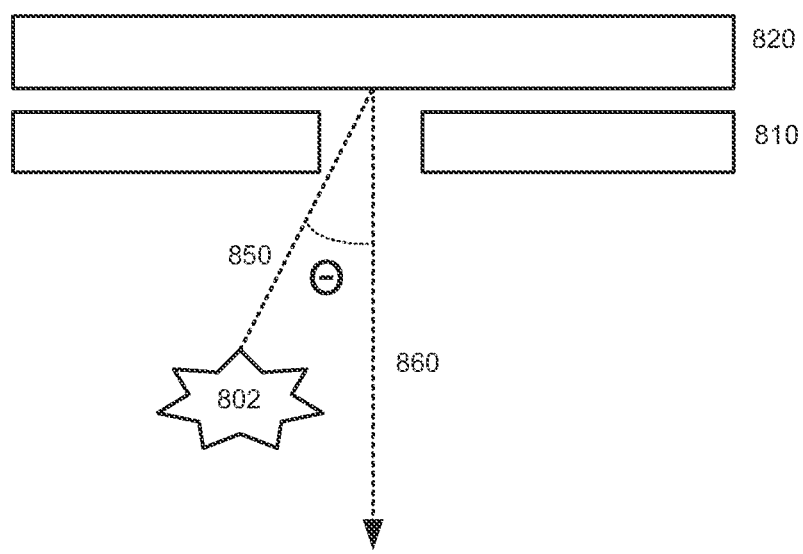
FIG. 11 shows additional details regarding a source location according to aspects of the invention.

As further shown in FIG. 11, the angle δ between the line 850 connecting source and center of the substrate 820 and the normal line 860 of the substrate may be preferably in a range of approximately 0° to 20°.

Figure 12:
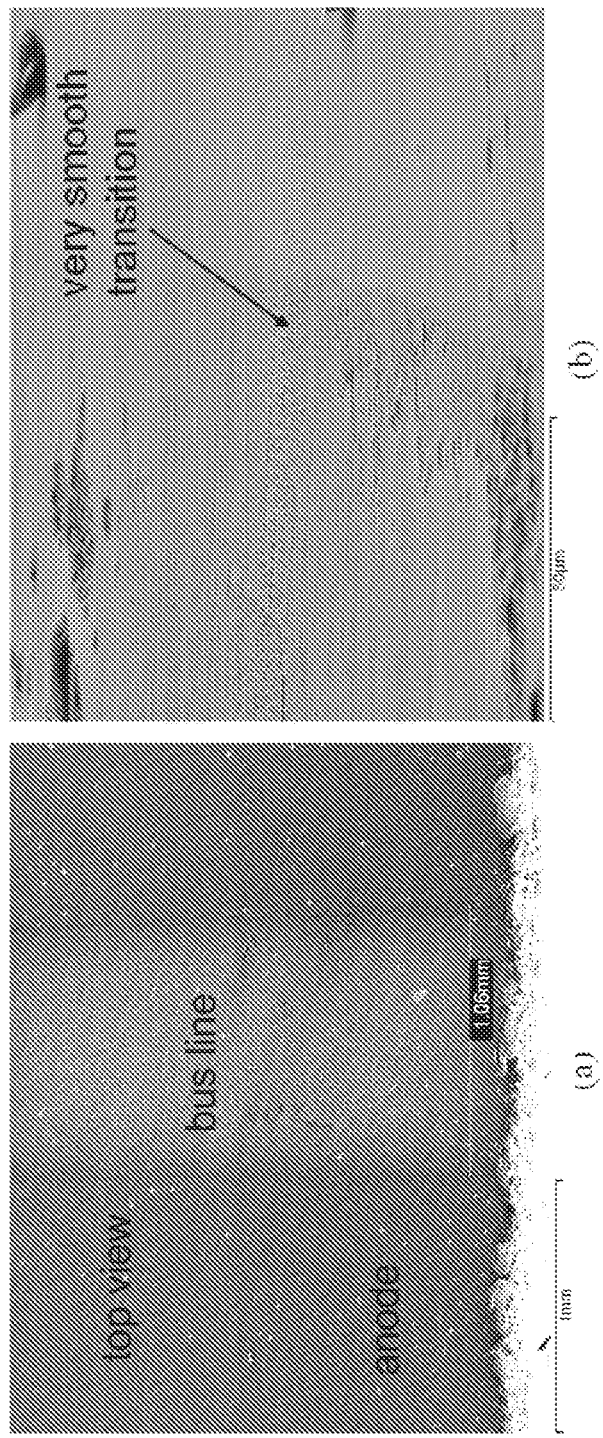
FIG. 12 shows SEM images of (a) top view and (b) side view 2600 Å aluminum bus line deposited by VTE through a shadow mask.
Figure 13A:
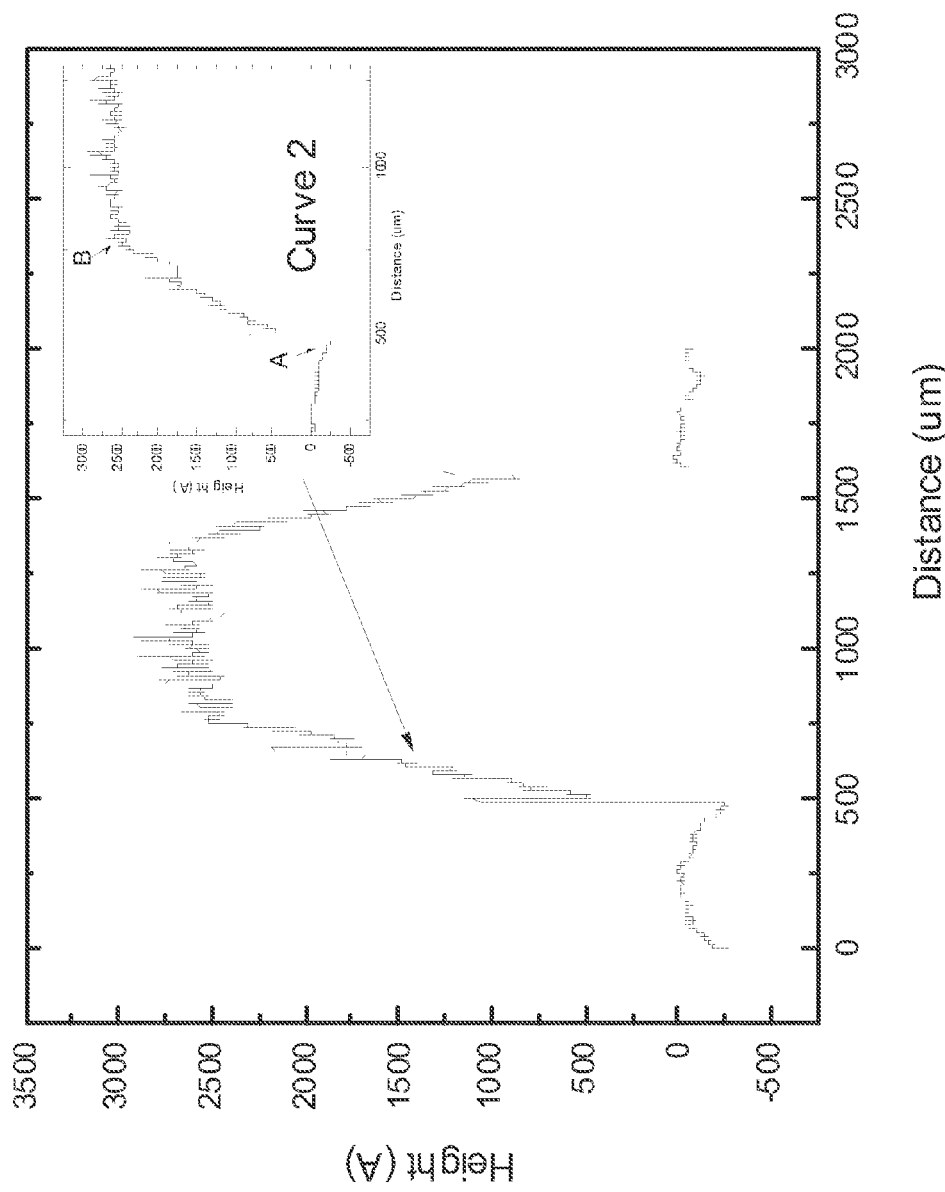
FIGS. 13A-13B show test results of a VTE deposited aluminum metal bus line (Curve 2), and a second derivative of Curve 2, where a smooth transition of about 0.06 is acquired.
Figure 13B:
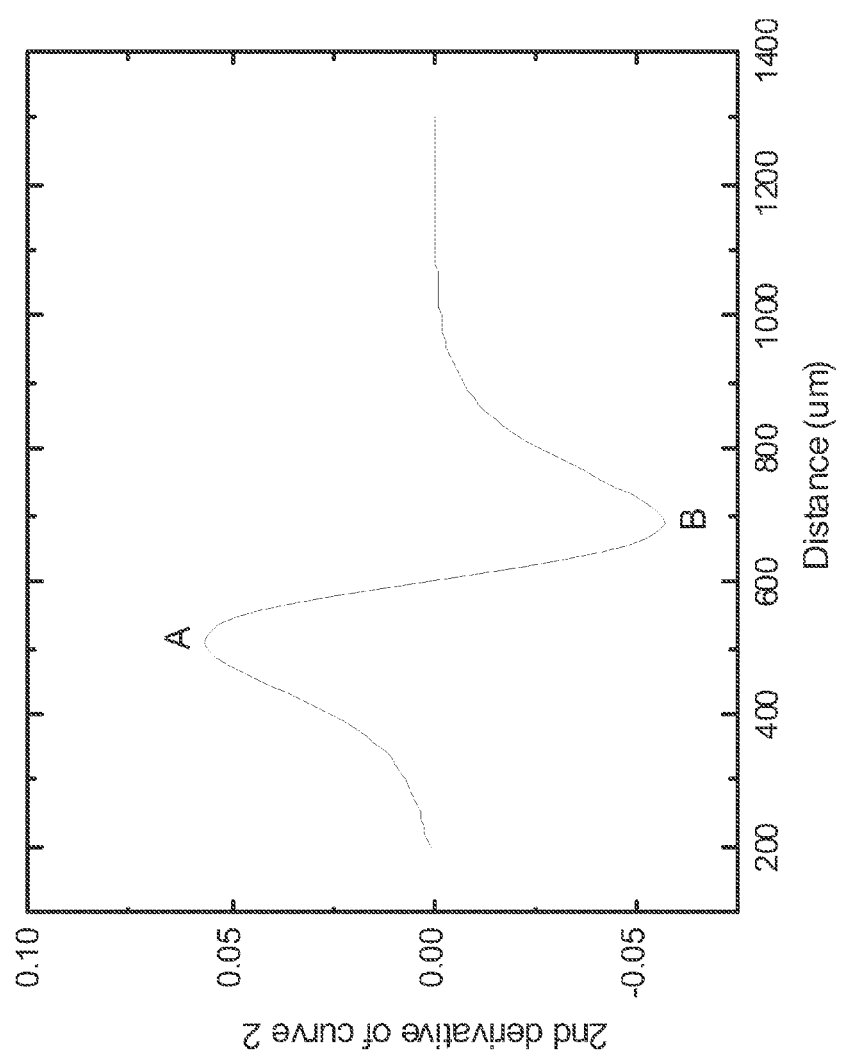

The inventors have produced SEM images of VTE patterned bus line, where very gradual sidewall profile and edge transitions are clearly observed. FIG. 12 is an SEM images of (a) top view and (b) side view of a 2600 Å aluminum bus line deposited by VTE through a shadow mask. FIG. 13A shows an exemplary profile of a tested VTE metal bus line. The extracted slope angle for Curve 2 is approximately 0.05°. The transition rates at Points A and B on this curve also determine the smoothness of the sidewall profile at the edge transition. Mathematically, the rate of change of gradient, i.e. how smooth the transition is at the top and bottom of the bus line, can be acquired by calculating the second derivative of the curve with respect to distance along the substrate surface at these locations. For the purpose of extracting second derivative of points A and B, the profile curve is first smoothed to eliminate local profile variation caused by asperities. The second derivative of the smoothed curve was then calculated. The maximum absolute value of the second derivative of Curve 2 plotted in FIG. 13B is about 0.06, which is about 40 times smaller than that of a curve derived from a conventional processing technique, discussed further below. Accordingly, in embodiments, the maximum absolute value of the second derivative at both edges (points A and B) of the bus line layer may be, for example, less than 1.0, less than 0.5, less than 0.1, etc.

Figure 14:
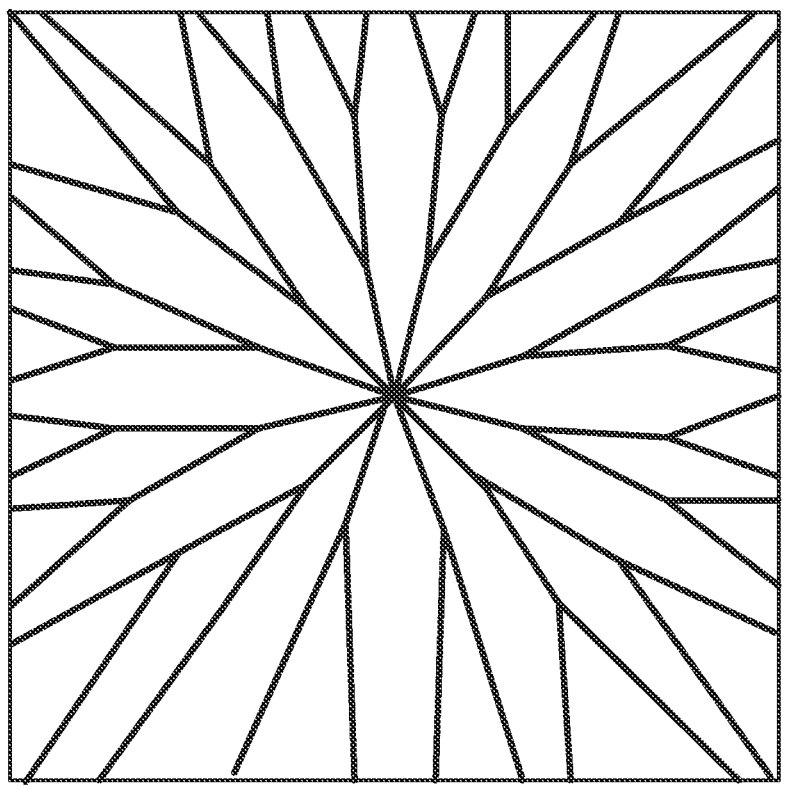
FIG. 14 depicts an exemplary bus line pattern according to further aspects of the invention.

It should also be noted that various patterns for the bus lines are possible, including, for example, a branch-shaped pattern as shown in FIG. 14. An exemplary device was constructed with a similar branch-shaped structure of metal bus lines, as shown in FIG. 14, made of 2600 Å aluminum. A completed 15 cm×15 cm OLED light panel was shown to provide uniform light output using such a structure, and, importantly, after extended operation, the OLED light panel did not develop any electrical shorts.

An organic light emitting device is also provided including features as described herein. The device may include an anode, a cathode, and an organic emissive layer disposed between the anode and the cathode. The organic emissive layer may include a host and a phosphorescent dopant, exemplary materials of which are discussed further below, following the comparative test results.

Comparative Test Results

To compare the present subject matter to more conventional approaches, the inventors fabricated a large-area white OLED light panel using lift-off processed metal bus lines. In this example, an insulating layer was not included. A panel structure similar to that illustrated in FIG. 3 was constructed. The organic material was in direct contact with electrode and bus lines. The layout of the panel comprised nine stripes, and the anode of each OLED stripe was connected to metal bus lines, as shown in FIG. 3. The bus lines were patterned using photo lithography, where 6000 Å gold was e-beam evaporated, followed by a lift-off process. The OLED included, in order, an anode (1200 Å thick ITO), a hole injection layer (100 Å thick LG101, available from LG Chemicals of Korea), a hole transport layer (3800 Å thick NPD), a first emissive layer (200 Å thick Host B doped with 24% Green Dopant A and 0.6% Red Dopant A), a second emissive layer (75 Å thick Blue Host A doped with 20% Blue Dopant A), a blocking layer (50 Å thick Blue Host A), a layer (450 Å thick layer of LG201, available from LG Chemicals of Korea and 40% LiQ), and a cathode (10 Å thick layer of LiQ (lithium quinolate) and a 1000 Å thick layer of Al).

Figure 21A:
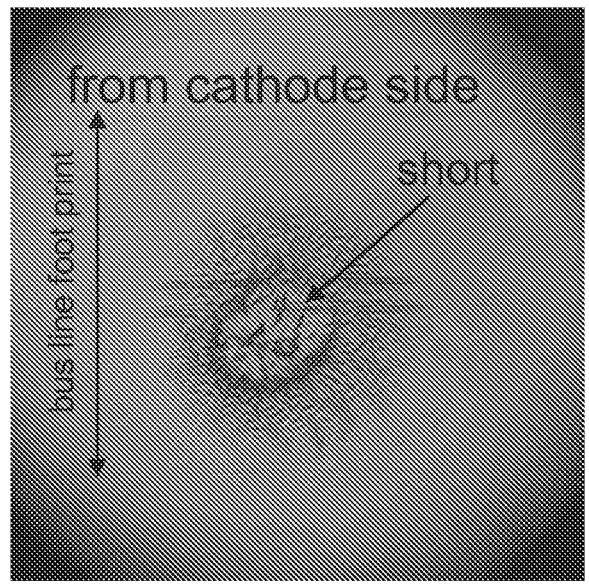
FIGS. 21A-21B show microscopic images of short spot on a bus line from the view of cathode side and anode side.
Figure 21B:
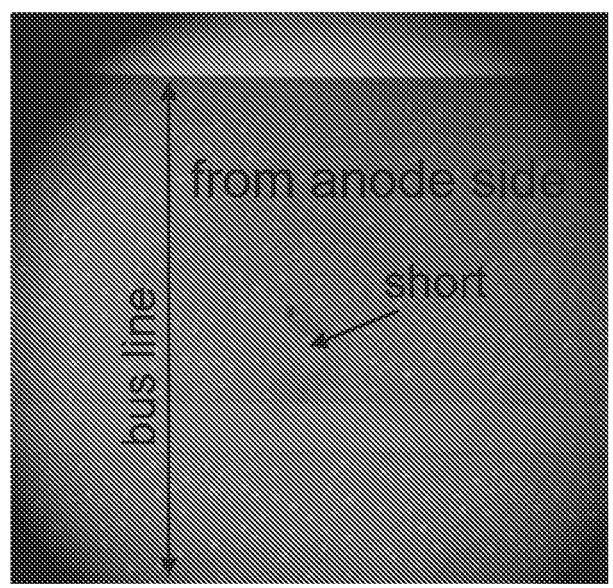

The inventors found that the panel lit up initially, however, a short circuit developed very soon on one of the bus lines. See FIGS. 21A and 21B for cathode side, and anode side views, respectively. This single short resulted in the failure of the whole panel.

Figure 15:
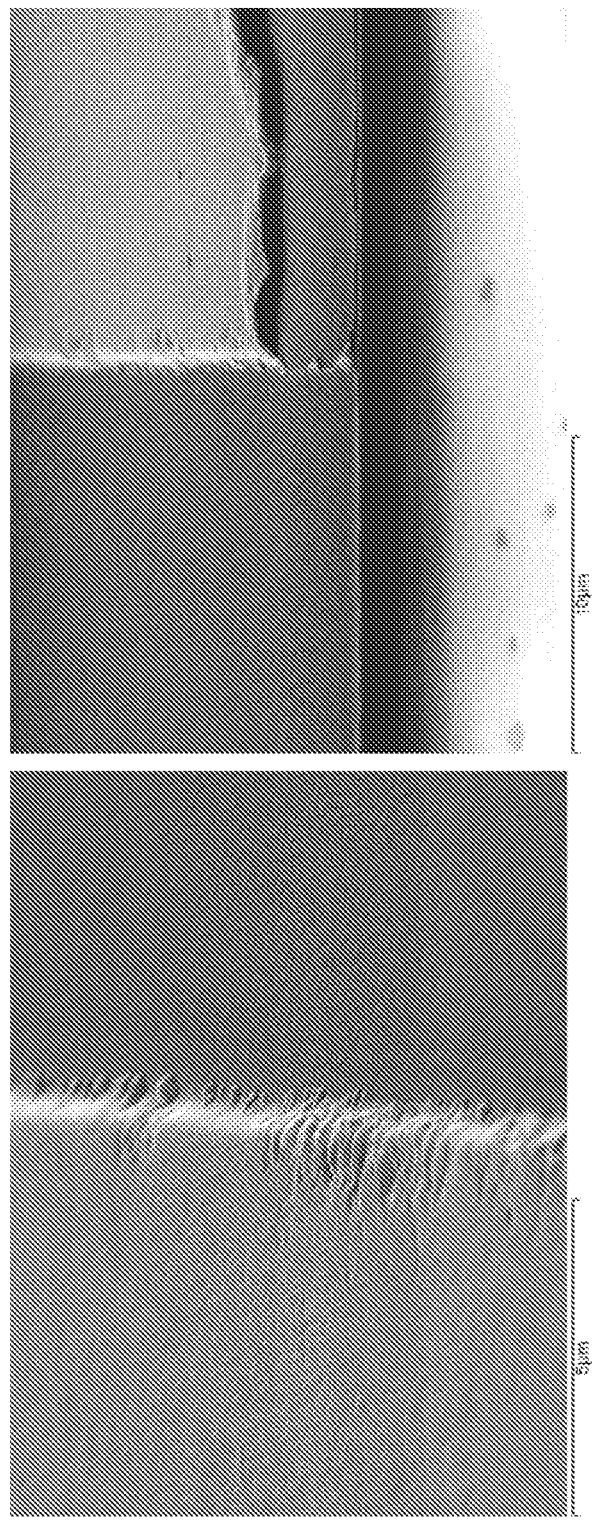
FIG. 15 includes SEM images of a tilted top view of 6000 Å metal bus line profile patterned through lift-off process.
Figure 16:
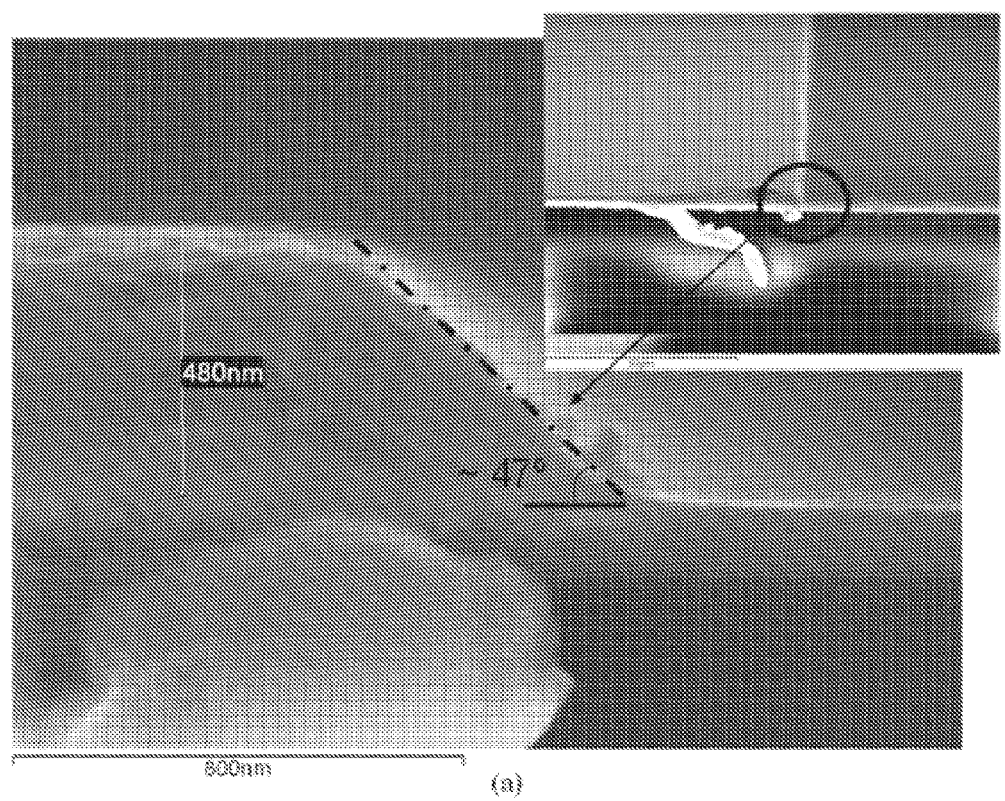
FIG. 16 is an SEM image of a side view of 6000 Å metal bus line profile patterned through lift-off process.

Further analysis showed that metal bus lines formed through a lift-off process have a sharp sidewall profile. FIG. 15 shows scanning electron microscope (SEM) images (taken from above and to the side) of 6000 Å gold bus lines deposited on an ITO anode. An SEM image of a side view of the metal layer is shown in FIG. 16. The slope of the sidewall was found to be on average approximately 45-47°. The sharp corners at top and base of the sidewalls will induce strong local electrical fields that can potentially cause an electrical short. In addition, the organic layers have total thickness typically in the range of a few hundred nm, and it is hard to uniformly coat such thin layers of material over a tall and steep sidewall. This will also result in a strong local electrical field where the bus line has the thinnest coverage which can potentially cause an electrical short. Electrical shorting is also likely at places where the organic layer fails to cover the bus lines.

Figure 17:
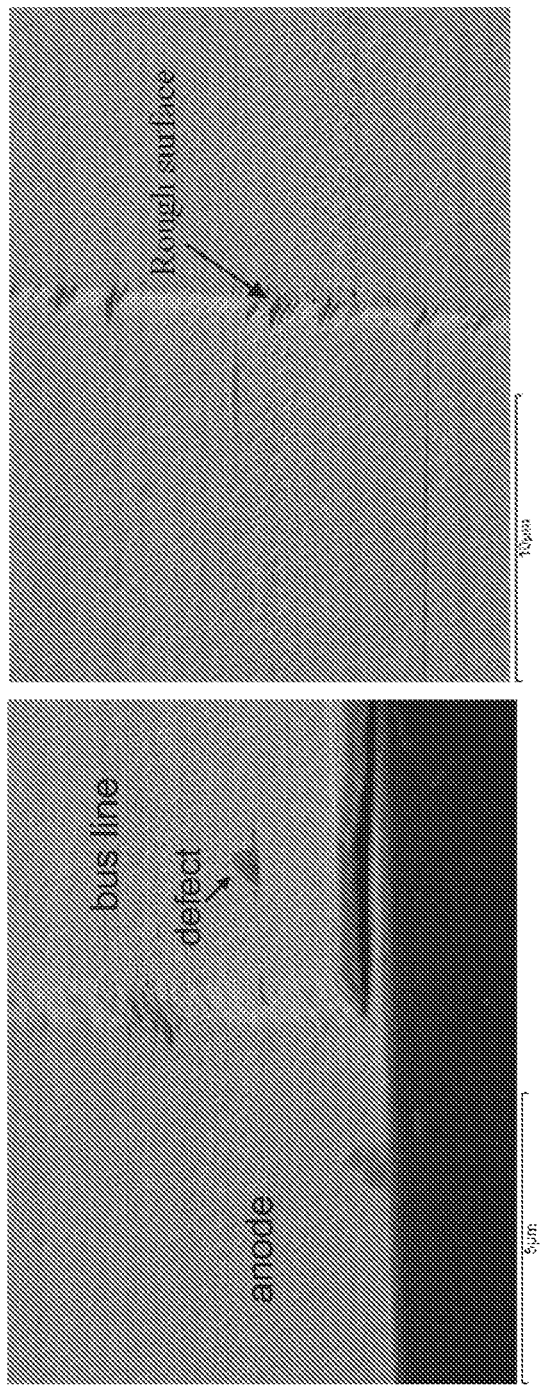
FIG. 17 includes SEM images of a metal bus line profile patterned through lift-off process, where rough edge surfaces and defects can be found.

In addition to the abrupt transition at the bus line edge, asperities on the metal side walls are also as large as hundreds of nanometers, as seen in FIG. 17. These sharp peaks can also serve as potential shorting paths. Finally, particulate defects introduced by photolithography and lift-off may also cause electrical shorts. One such defect is shown in FIG. 17. In order to prevent shorting, a subsequent protective insulating layer (e.g. polyimide or $SiO_2$) is normally required to cover the bus line.

Figure 18:
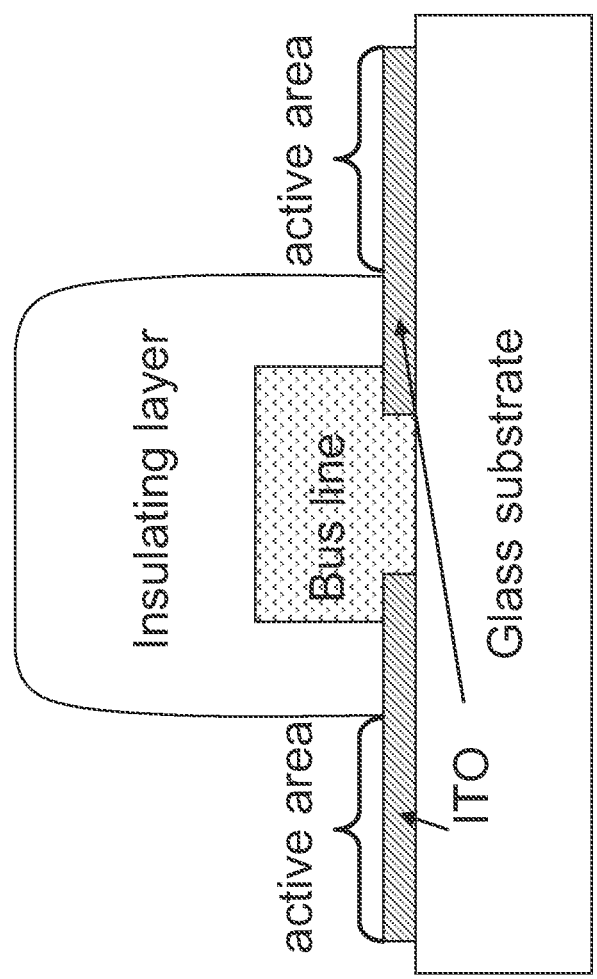
FIG. 18 is a cross sectional view of a device including an insulating layer covering the edge of bus lines.

The area required for the overlap of the insulating layer covers part of the emissive area and decreases the fill factor of the OLED light panel, as illustrated in FIG. 18. Moreover, wet processes are involved in the lift-off method, such as developing and dissolving. Polymer insulators can easily absorb moisture during process (or even after process, during substrate storage) and thus water may be retained in the device, reducing shelf life time. Also, photolithography and lift-off processes generate defects more easily, which may cause catastrophic failure of the device. Finally, photolithography and lift-off are time consuming and expensive processes.

Figure 19:
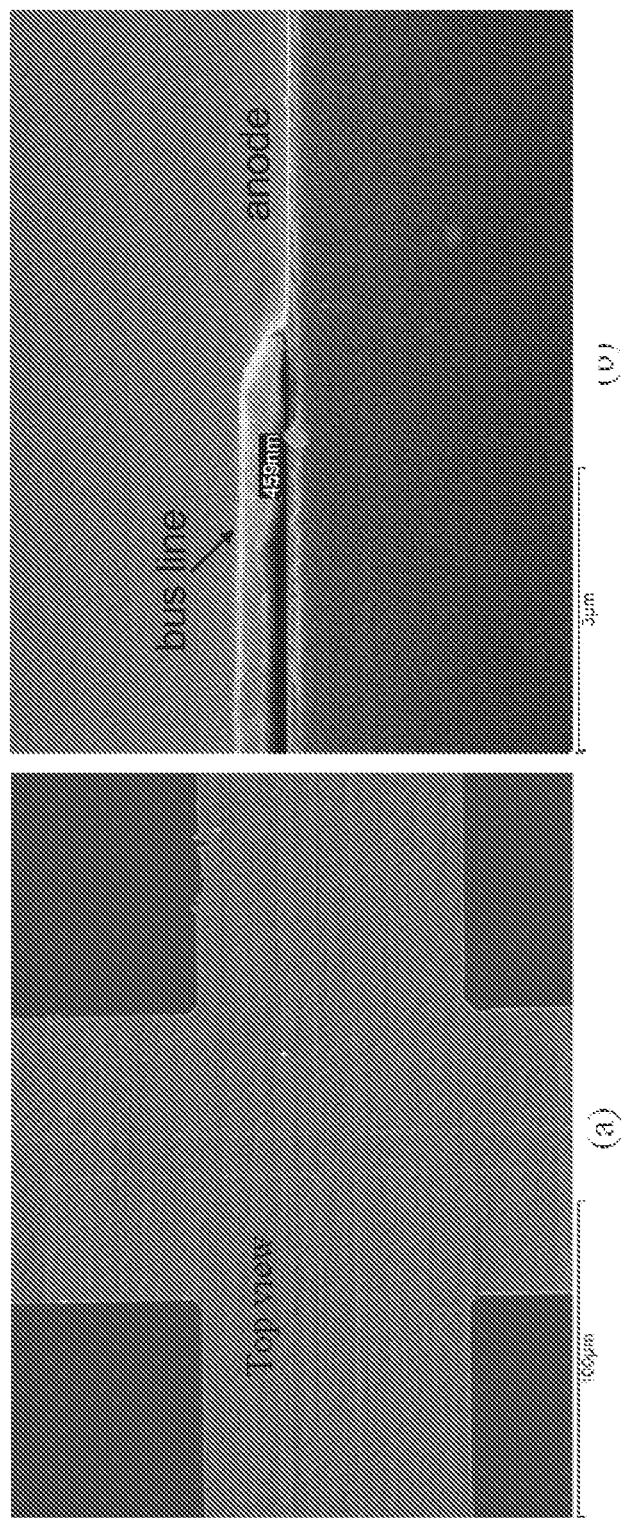
FIG. 19 shows scanning electron microscope (SEM) images of (a) top view and (b) side view of metal bus line profile fabricated from modified photolithography process.
Figure 20A:
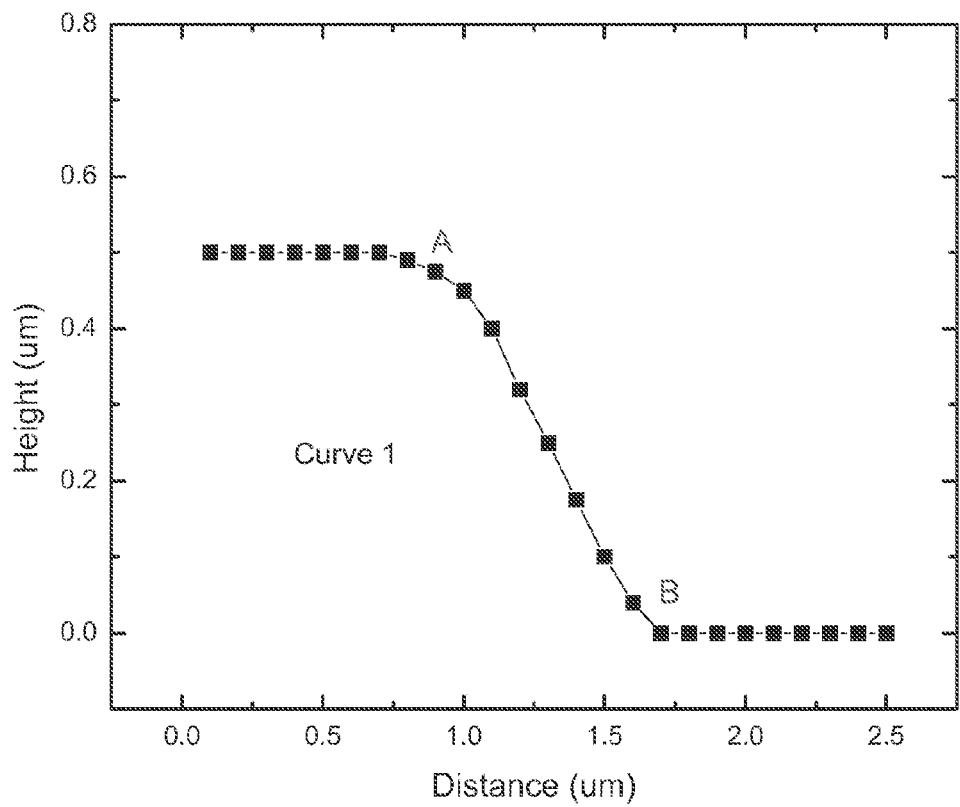
FIGS. 20A-20B show a profile of a metal bus line formed through a modified lift-off process (Curve 1) and a second derivative of Curve 1.
Figure 20B:
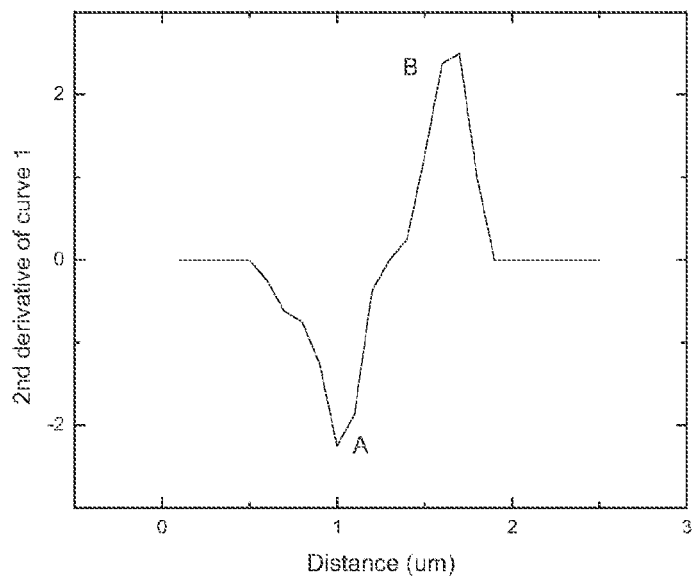

The bus line profile from a lift-off process can be modified by using different photoresist, and adjusting exposure time etc. FIG. 19 shows scanning electron microscope (SEM) images of (a) top view and (b) side view of a metal bus line profile fabricated from a modified photolithography process. A bus line sidewall profile deposited and patterned in a modified manner including a lift-off process is plotted in FIG. 20A. The angle of the slope extracted from this Curve 1 is reduced to about 33°. Using a modified lift-off process, the slope angle of the sidewall profile is less than 47° achieved using a conventional lift-off process in FIG. 16. However, this slope of the sidewall is still steep enough to cause strong localized electric fields and potentially an electrical short. The extracted maximum absolute value of the second derivative of Curve 1 is about 2.375, as shown in FIG. 20B. Thus, comparing the results shown in FIGS. 20A and 20B to those of the exemplary embodiments previously discussed with respect to FIGS. 13A and 13B, it can be seen that bus lines deposited by VTE through a shadow mask can result in transitions that are orders of magnitude smoother than lift-off processed bus lines.

Benefits of metal bus lines with a relatively smooth profile may include: 1) less shorting owing to the smooth sidewall transition, 2) larger emissive area owing to the elimination of the insulating layer which enables higher efficiency and longer operational life time for a constant light output, 3) longer shelf life time owing to the elimination of the insulating layer, such that water is no longer stored within the device 4) less shorting or visual defect owing to fewer particles from fewer handling steps, and/or 5) lower cost owing to reduced/ eliminated photolithography processes. Although specific embodiments discussed herein have used, for example, vacuum thermal evaporation (VTE) to pattern the bus lines, other vapor deposition system may include sputter deposition, e-beam evaporation and chemical vapor deposition (CVD).

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

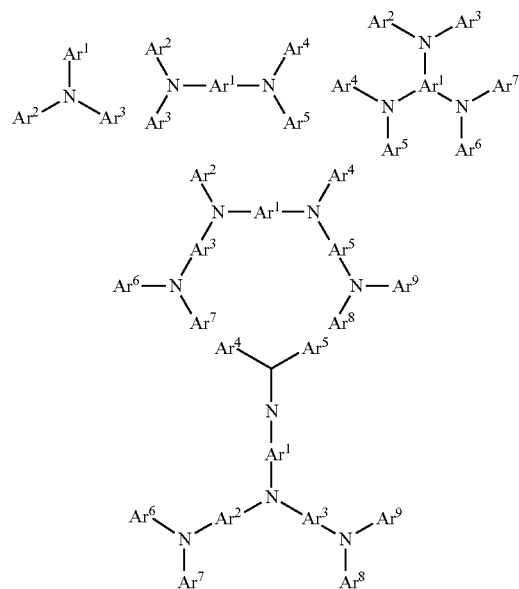

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and sclenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

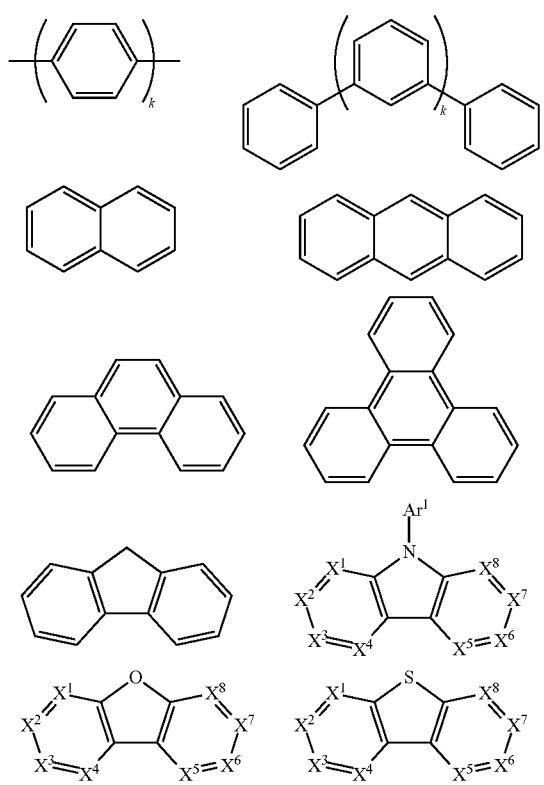

k is an integer from 1 to 20; $X^1$ to $X^8$ is CH or N; $Ar^1$ has the same group defined above.

Examples of metal complexes used in HIL or HTL include, but not limit to the following general formula:

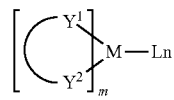

M is a metal, having an atomic weight greater than 40; ($Y^1$-$Y^2$) is a bindentate ligand, $Y^1$ and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, ($Y^1$-$Y^2$) is a 2-phenylpyridine derivative.

In another aspect, ($Y^1$-$Y^2$) is a carbene ligand.

In another aspect, M is selected from Ir, Pt, Os, and Zn.

In a further aspect, the metal complex has a smallest oxidation potential in solution vs. $Fc^+$/Fc couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant.

Examples of metal complexes used as host are preferred to have the following general formula:

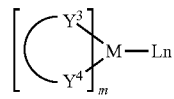

M is a metal; ($Y^3$-$Y^4$) is a bindentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

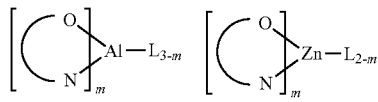

(O—N) is a bidentate ligand, having metal coordinated to atoms O and N.

In another aspect, M is selected from Ir and Pt.

In a further aspect, ($Y^3$-$Y^4$) is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atome, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

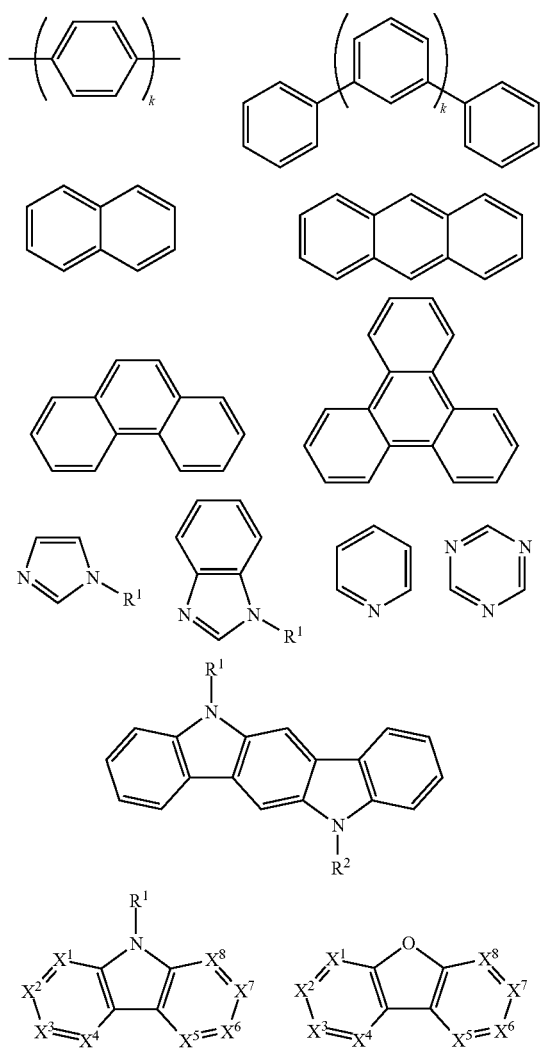
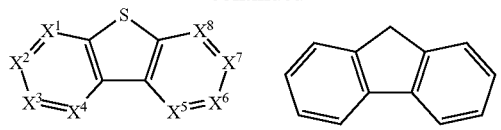
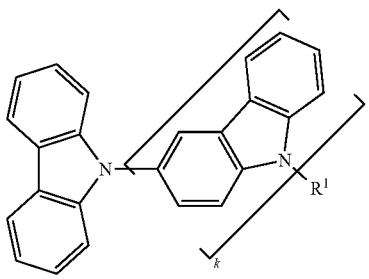
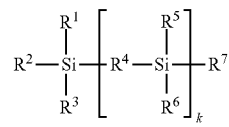
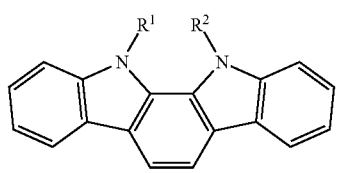

$R^1$ to $R^7$ is independently selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar's mentioned above.

k is an integer from 0 to 20.

$X^1$ to $X^8$ is selected from CH or N.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule used as host described above.

In another aspect, compound used in HBL contains at least one of the following groups in the molecule:

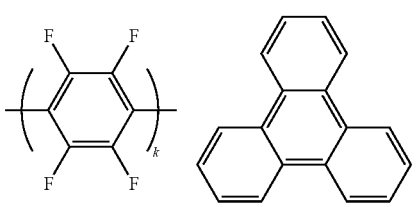

-continued

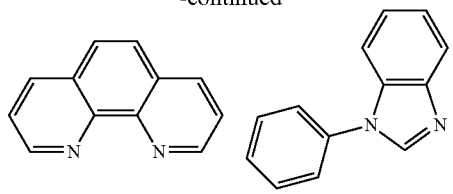
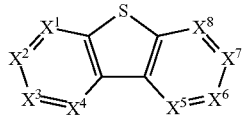
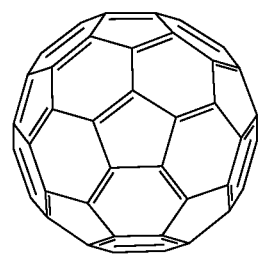
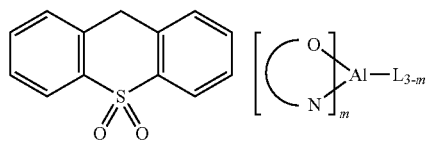
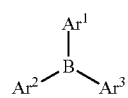

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

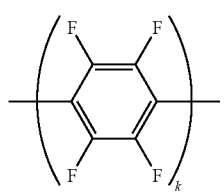
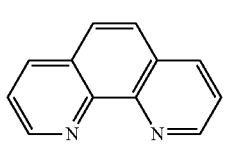

$R^1$ is selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar's mentioned above.

$Ar^1$ to $Ar^3$ has the similar definition as Ar's mentioned above.

k is an integer from 0 to 20.

$X^1$ to $X^8$ is selected from CH or N.

In another aspect, the metal complexes used in ETL contains, but not limit to the following general formula:

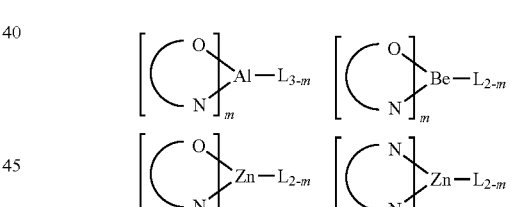

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of the OLED device, the hydrogen atoms can be partially or fully deuterated.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table XXX below. Table XXX lists non-limiting classes of materials, non-limiting examples of compounds for each class, and references that disclose the materials.

TABLE XXX
| MATERIAL | EXAMPLES OF MATERIAL | PUBLICATIONS |
|---|---|---|
| Hole injection materials | | |
| Phthalocyanine and porphryin compounds | 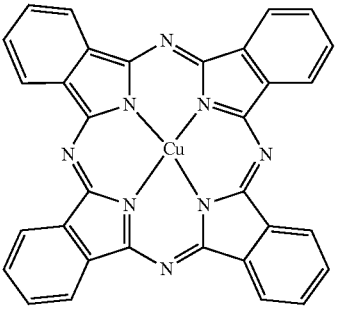 | Appl. Phys. Lett. 69, 2160 (1996) |
| Starburst triarylamines | 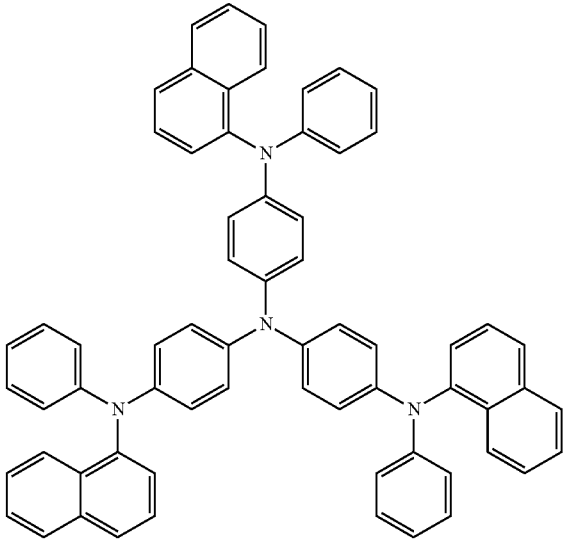 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polypthiophene) | 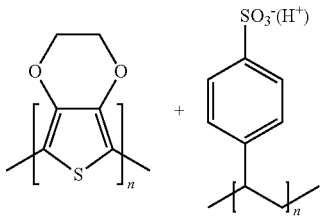 | Synth. Met. 87, 171 (1997) WO2007002683 |
| Phosphonic acid and sliane SAMs | 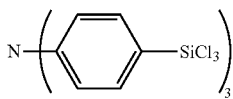 | US20030162053 |

TABLE XXX-continued
| MATERIAL | EXAMPLES OF MATERIAL | PUBLICATIONS |
|---|---|---|
| Triarylamine or polythiophene polymers with conductivity dopants | 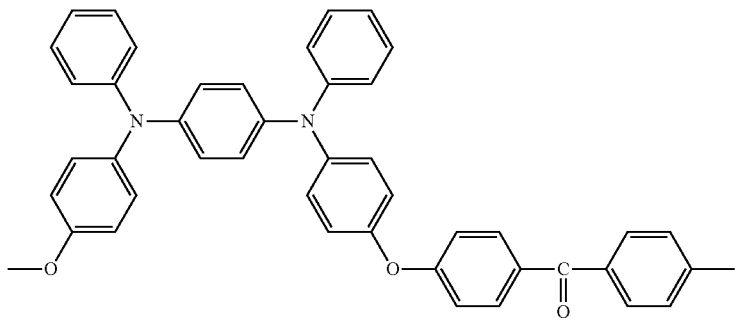 and 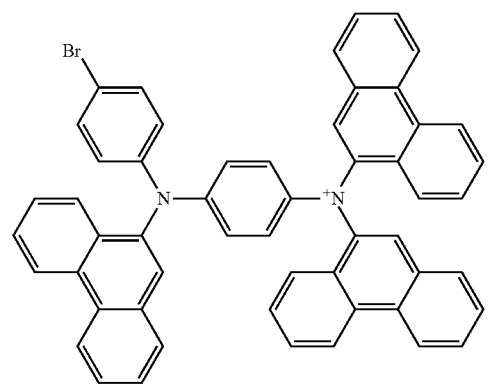 [SMILES: Brc1ccc(N(c2ccc([NH+](c3cc4ccccc4c4ccccc34)c3cc4ccccc4c4ccccc34)cc2)c2cc3ccccc3c3ccccc23)cc1] 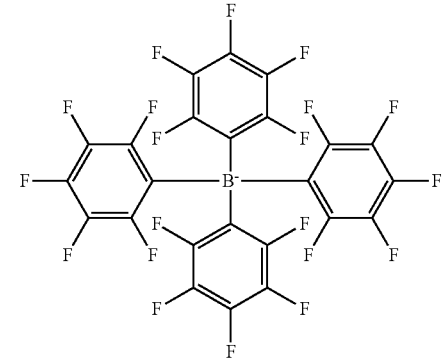 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | EP1725079A1 |
| Arylamines complexed with metal oxides such as molybdenum and tungsten oxides | 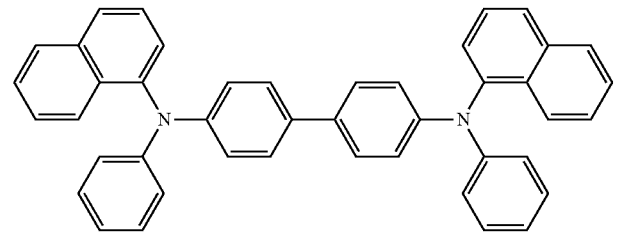 + $MoO_x$ | SID Symposium Digest, 37, 923 (2006) WO2009018009 |
| p-type semiconducting organic complexes | 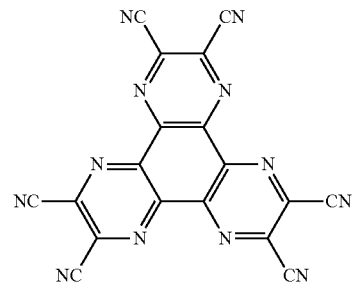 [SMILES: N#Cc1nc2c3nc(C#N)c(C#N)nc3c3nc(C#N)c(C#N)nc3c2nc1C#N] | US20020158242 |

TABLE XXX-continued

| MATERIAL | EXAMPLES OF MATERIAL | PUBLICATIONS |
|---|---|---|
| Metal organometallic complexes | | US20060240279 |
| Cross-linkable compounds | | US20080220265 |

Hole transporting materials

| | | |
|---|---|---|
| Triarylamines (e.g., TPD, α-NPD) | | Appl. Phys. Lett. 51, 913 (1987) |
| | | U.S. Pat. No. 5,061,569 |

TABLE XXX-continued
| MATERIAL | EXAMPLES OF MATERIAL | PUBLICATIONS |
|---|---|---|
| | 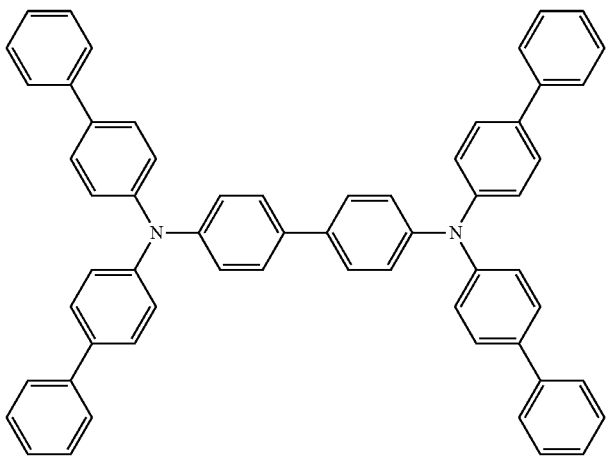 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 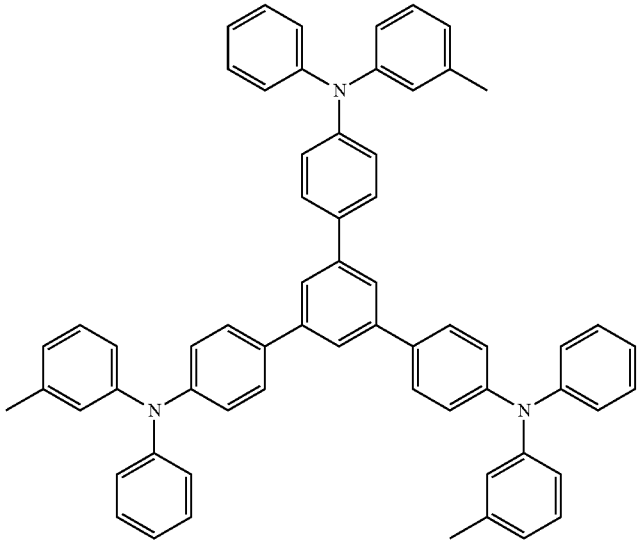 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |
| | 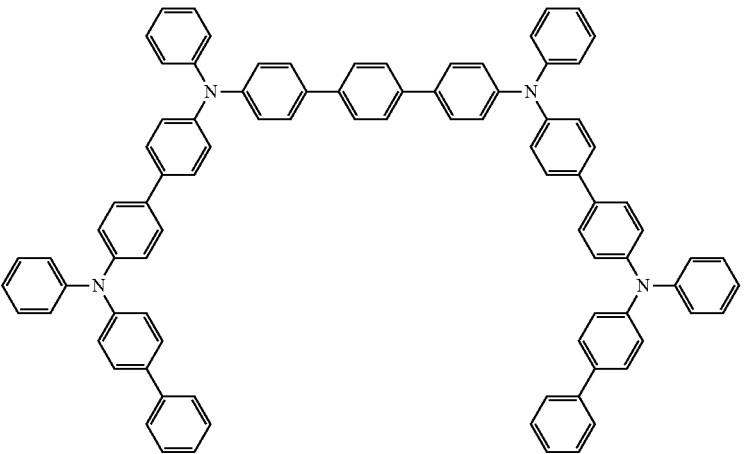 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |

| MATERIAL | EXAMPLES OF MATERIAL | PUBLICATIONS |
|---|---|---|
| | 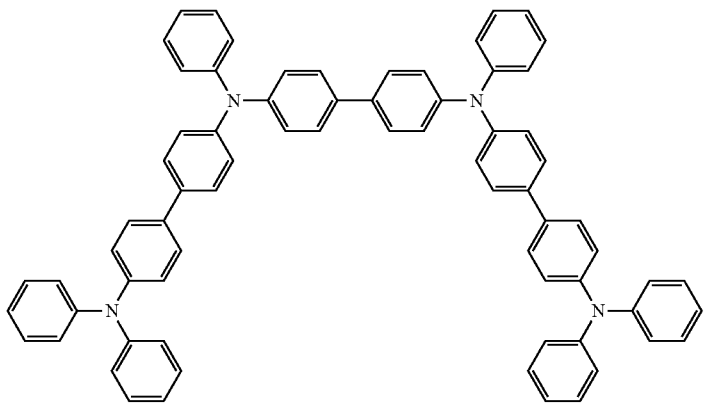 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |
| Triaylamine on spirofluorene core | 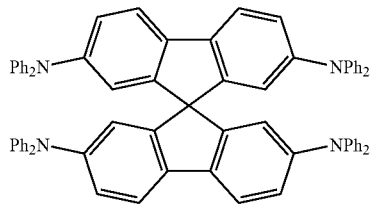 | Synth. Met. 91, 209 (1997) |
| Arylamine carbazole compounds | 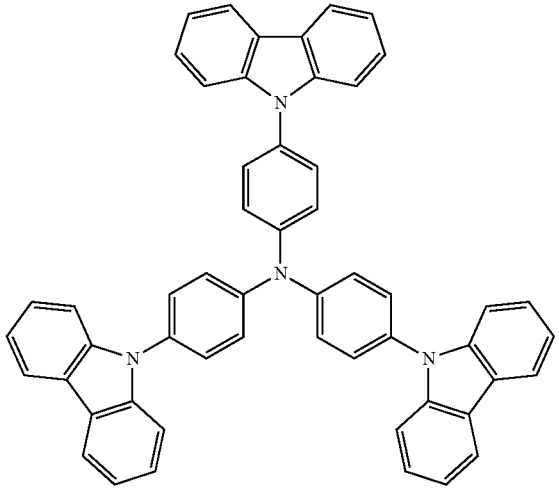 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994), US20080124572 |
| Triarylamine with (di)benzothiophene/ (di)benzofuran | 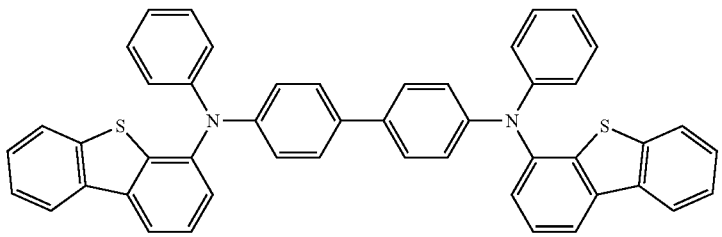 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 |

TABLE XXX-continued
| MATERIAL | EXAMPLES OF MATERIAL | PUBLICATIONS |
|---|---|---|
| Indolocarbazoles | 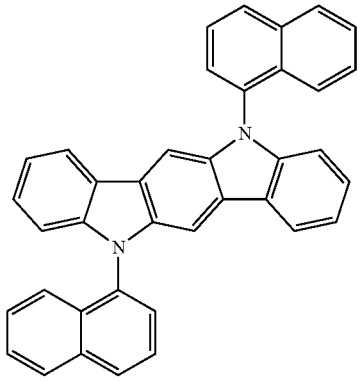 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 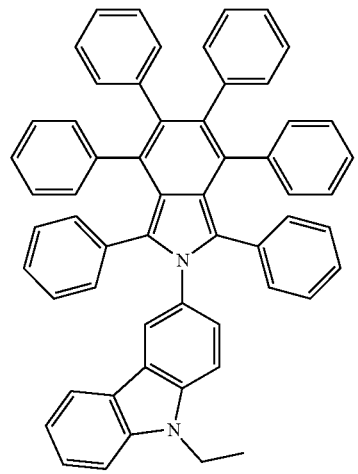 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 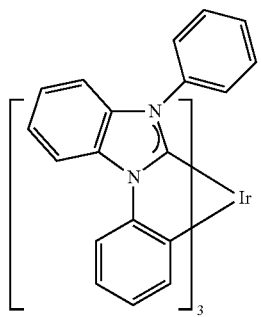 | US20080018221 |
Phosphorescent OLED host materials
Red hosts
| Arylcarbazoles | 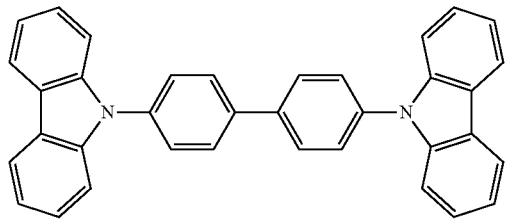 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |

TABLE XXX-continued
| MATERIAL | EXAMPLES OF MATERIAL | PUBLICATIONS |
|---|---|---|
| Metal 8-hydroxyquinolates (e.g., Alq₃, BAlq) | 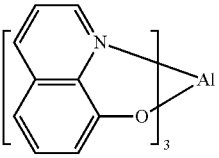 | Nature 395, 151 (1998) |
| | 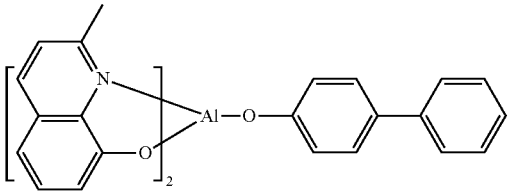 | US20060202194 |
| | 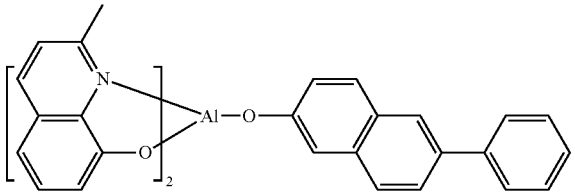 | WO2005014551 |
| | 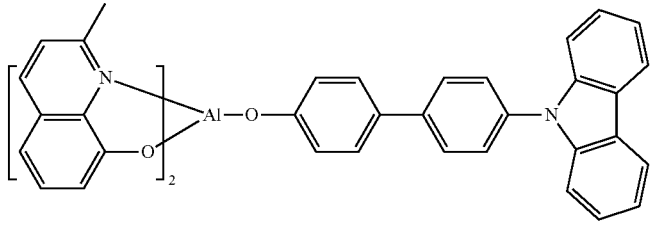 | WO2006072002 |
| Metal phenoxybenzothiazole compounds | 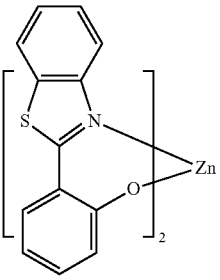 | Appl. Phys. Lett. 90, 123509 (2007) |
| Conjugated oligomers and polymers (e.g., polyfluorene) | 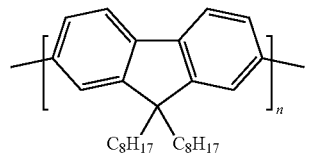 | Org. Electron. 1, 15 (2000) |
| Aromatic fused rings | 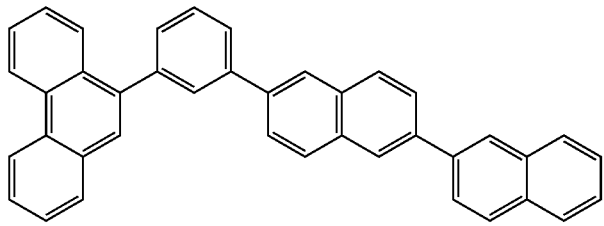 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |

TABLE XXX-continued
| MATERIAL | EXAMPLES OF MATERIAL | PUBLICATIONS |
|---|---|---|
| Zinc complexes | 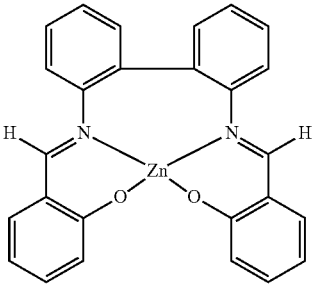 | WO2009062578 |
| Green hosts | | |
| Arylcarbazoles | 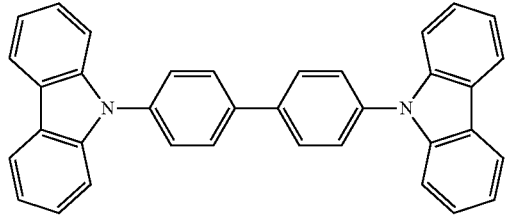 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 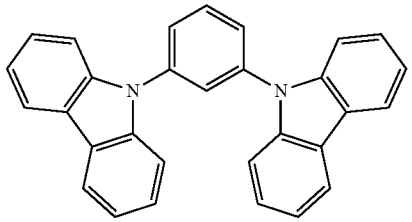 [SMILES: c1cc(-n2c3ccccc3c3ccccc32)cc(-n2c3ccccc3c3ccccc32)c1] | US20030175553 |
| | 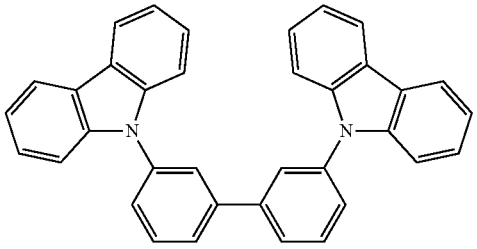 [SMILES: c1cc(-c2cccc(-n3c4ccccc4c4ccccc43)c2)cc(-n2c3ccccc3c3ccccc32)c1] | WO2001039234 |
| Aryltriphenylene compounds | 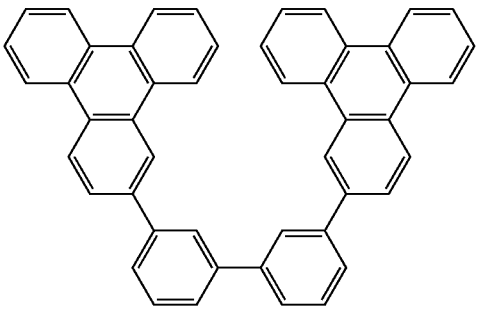 [SMILES: c1cc(-c2cccc(-c3ccc4c5ccccc5c5ccccc5c4c3)c2)cc(-c2ccc3c4ccccc4c4ccccc4c3c2)c1] | US20060280965 |

TABLE XXX-continued

| MATERIAL | EXAMPLES OF MATERIAL | PUBLICATIONS |
|---|---|---|
| | | US20060280965 |
| | | WO2009021126 |
| Donor acceptor type molecules | | WO2008056746 |
| Aza-carbazole/ DBT/DBF | | JP2008074939 |
| Polymers (e.g., PVK) | | Appl. Phys. Lett. 77, 2280 (2000) |

TABLE XXX-continued

| MATERIAL | EXAMPLES OF MATERIAL | PUBLICATIONS |
| --- | --- | --- |
| Spirofluorene compounds | | WO2004093207 |
| Metal phenoxybenzooxazole compounds | | WO2005089025 |
| | | WO2006132173 |
| | | JP200511610 |
| Spirofluorene-carbazole compounds | | JP2007254297 |

| MATERIAL | EXAMPLES OF MATERIAL | PUBLICATIONS |
|---|---|---|
| | 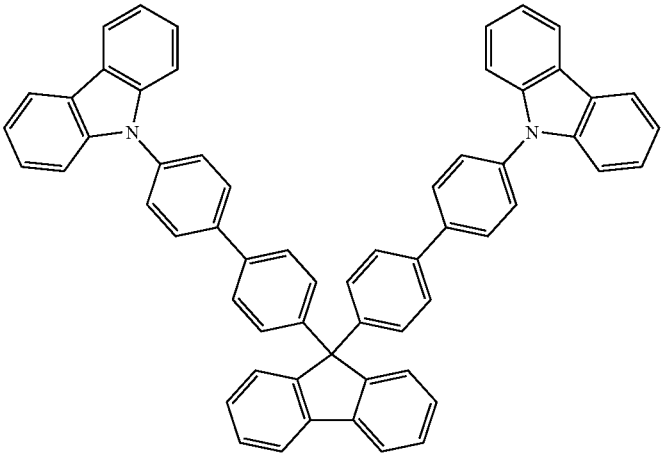 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolocabazoles | 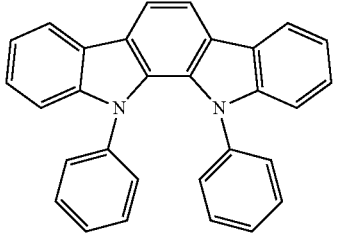 [SMILES: c1ccc(-n2c3ccccc3c3ccc4c5ccccc5n(-c5ccccc5)c4c32)cc1] | WO2007063796 |
| | 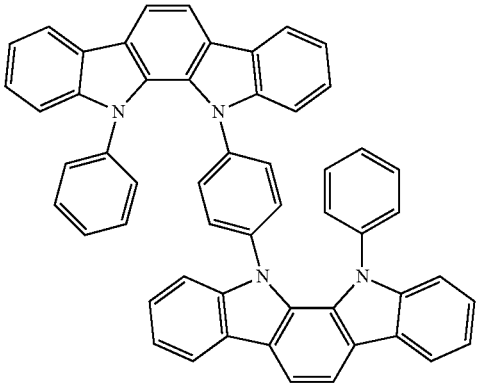 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 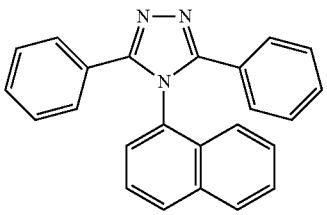 [SMILES: c1ccc(-c2nnc(-c3ccccc3)n2-c2cccc3ccccc23)cc1] | J. Appl. Phys. 90, 5048 (2001) |
| | 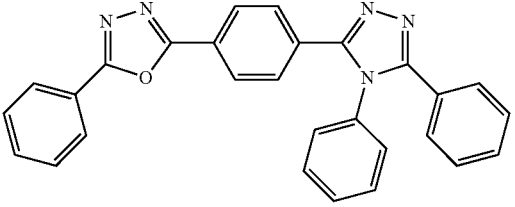 [SMILES: c1ccc(-c2nnc(-c3ccc(-c4nnc(-c5ccccc5)n4-c4ccccc4)cc3)o2)cc1] | WO2004107822 |

TABLE XXX-continued

| MATERIAL | EXAMPLES OF MATERIAL | PUBLICATIONS |
| --- | --- | --- |
| Tetraphenylene complexes | | US20050112407 |
| Metal phenoxypyridine compounds | | WO2005030900 |
| Metal coordination complexes (e.g., Zn, Al with N^N ligands) | | US20040137268, US20040137267 |

Blue Hosts

| | | |
| --- | --- | --- |
| Arylcarbazoles | | Appl. Phys. Lett. 82, 2422 (2003) |
| | | US20070190359 |

TABLE XXX-continued
| MATERIAL | EXAMPLES OF MATERIAL | PUBLICATIONS |
|---|---|---|
| Dibenzothiophene/<br>Dibenzofuran-<br>carbazole compounds | 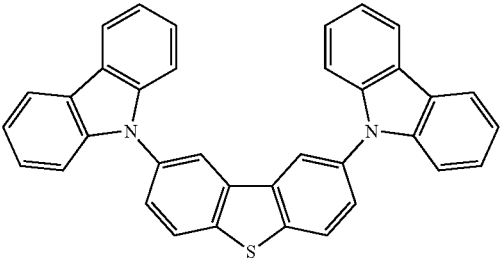 [SMILES: c1ccc2c(c1)c1ccccc1n2-c1ccc2sc3ccc(-n4c5ccccc5c5ccccc54)cc3c2c1] | WO2006114966,<br>US20090167162 |
| | 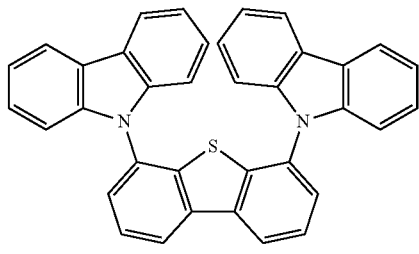 [SMILES: c1cc(-n2c3ccccc3c3ccccc32)c2sc3c(-n4c5ccccc5c5ccccc54)cccc3c2c1] | US20090167162 |
| | 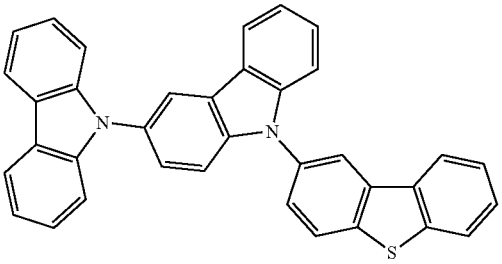 [SMILES: c1ccc2c(c1)sc1ccc(-n3c4ccccc4c4cc(-n5c6ccccc6c6ccccc65)ccc43)cc12] | WO2009086028 |
| | 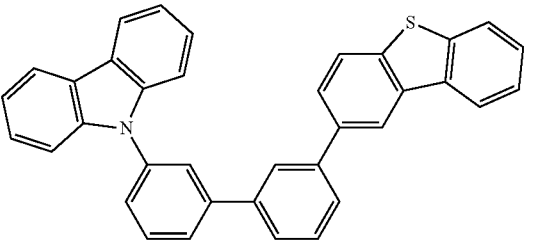 [SMILES: c1cc(-c2cccc(-n3c4ccccc4c4ccccc43)c2)cc(-c2ccc3sc4ccccc4c3c2)c1] | US20090030202,<br>US20090017330 |
| Silicon aryl<br>compounds | 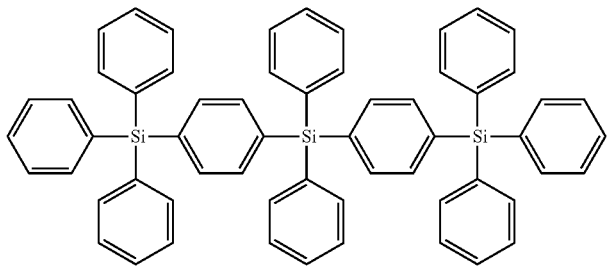 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 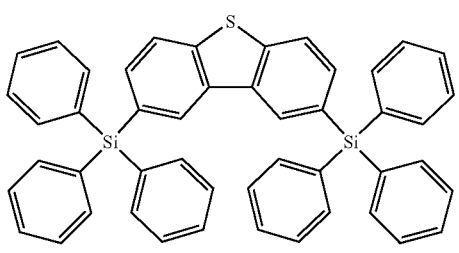 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE XXX-continued

| MATERIAL | EXAMPLES OF MATERIAL | PUBLICATIONS |
| --- | --- | --- |
| Silicon/Germanium aryl compounds | | EP2034538A |
| Aryl benzoyl ester | | WO2006100298 |
| High triplet metal organometallic complex | | U.S. Pat. No. 7,154,114 |

Phosphorescent dopants

Red dopants

| | | |
| --- | --- | --- |
| Heavy metal porphyrins (e.g., PtOEP) | | Nature 395, 151 (1998) |
| Iridium (III) organometallic complexes | | Appl. Phys. Lett. 78, 1622 (2001) |

TABLE XXX-continued

| MATERIAL | EXAMPLES OF MATERIAL | PUBLICATIONS |
|---|---|---|
| | | US2006835469 |
| | | US2006835469 |
| | | US20060202194 |
| | | US20060202194 |
| | | US20070087321 |

TABLE XXX-continued
| MATERIAL | EXAMPLES OF MATERIAL | PUBLICATIONS |
|---|---|---|
| | 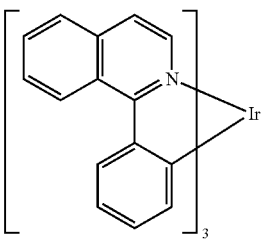 | US20070087321 |
| | 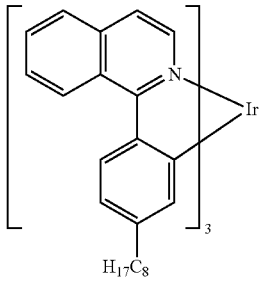 | Adv. Mater. 19, 739 (2007) |
| | 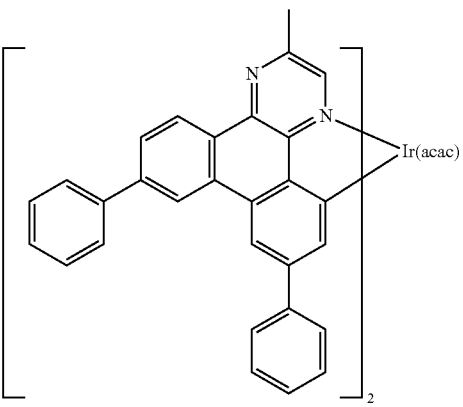 | WO2009100991 |
| | 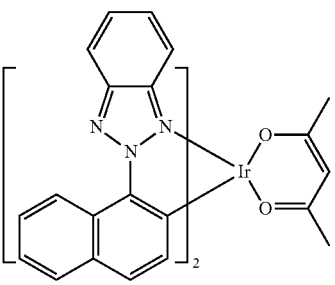 | WO2008101842 |
| Platinum (II) organometallic complexes | 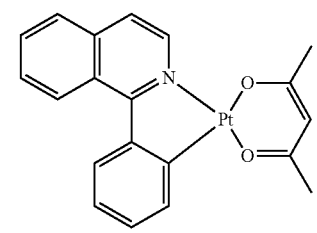 | WO2003040257 |

TABLE XXX-continued

| MATERIAL | EXAMPLES OF MATERIAL | PUBLICATIONS |
| --- | --- | --- |
| Osminum (III) complexes | [Os(PPhMe$_2$)$_2$ complex with CF$_3$-pyrazole-pyridine ligand] | Chem. Mater. 17, 3532 (2005) |
| Ruthenium (II) complexes | [Ru(PPhMe$_2$)$_2$ complex with tBu-pyrazole-isoquinoline ligand] | Adv. Mater. 17, 1059 (2005) |
| Rhenium (I), (II), and (III) complexes | [Re(CO)$_4$ complex with 8-hydroxyquinoline ligand] | US20050244673 |

Green dopants

| MATERIAL | EXAMPLES OF MATERIAL | PUBLICATIONS |
| --- | --- | --- |
| Iridium (III) organometallic complexes | [Ir(ppy)$_3$ complex] and its derivatives | Inorg. Chem. 40, 1704 (2001) |
|  | [Ir(ppy)$_2$(acac) complex] | US20020034656 |

TABLE XXX-continued
| MATERIAL | EXAMPLES OF MATERIAL | PUBLICATIONS |
|---|---|---|
| | 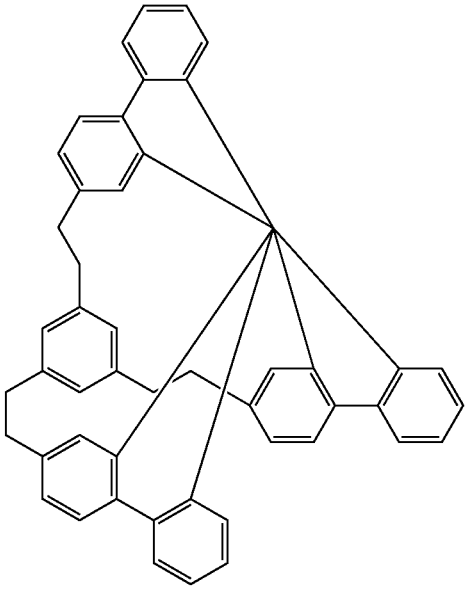 | U.S. Pat. No. 7,332,232 |
| | 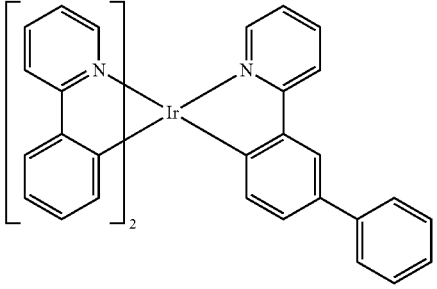 | US20090108737 |
| | 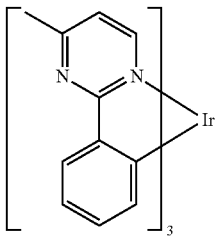 | US20090039776 |
| | 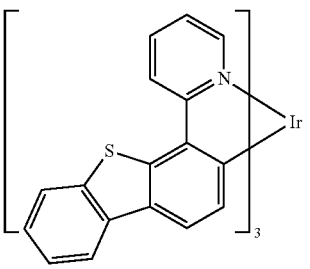 | U.S. Pat. No. 6,921,915 |

TABLE XXX-continued

| MATERIAL | EXAMPLES OF MATERIAL | PUBLICATIONS |
|---|---|---|
| | | U.S. Pat. No. 6,687,266 |
| | | Chem. Mater. 16, 2480 (2004) |
| | | US20070190359 |
| | | US20060008670<br>JP2007123392 |
| | | Adv. Mater. 16, 2003 (2004) |

TABLE XXX-continued

| MATERIAL | EXAMPLES OF MATERIAL | PUBLICATIONS |
|---|---|---|
| | | Angew. Chem. Int. Ed. 2006, 45, 7800 |
| | | WO2009050290 |
| | | US20090165846 |
| | | US20080015355 |
| Monomer for polymeric metal organometallic compounds | | U.S. Pat. No. 7,250,226, U.S. Pat. No. 7,396,598 |

TABLE XXX-continued
| MATERIAL | EXAMPLES OF MATERIAL | PUBLICATIONS |
|---|---|---|
| Pt (II) organometallic complexes, including polydentated ligands | 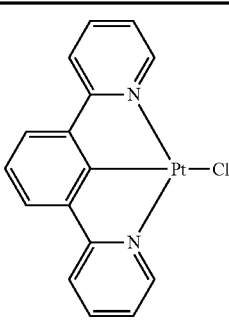 | Appl. Phys. Lett. 86, 153505 (2005) |
| | 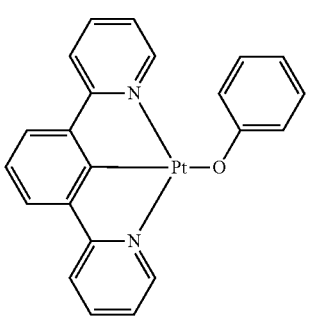 | Appl. Phys. Lett. 86, 153505 (2005) |
| | 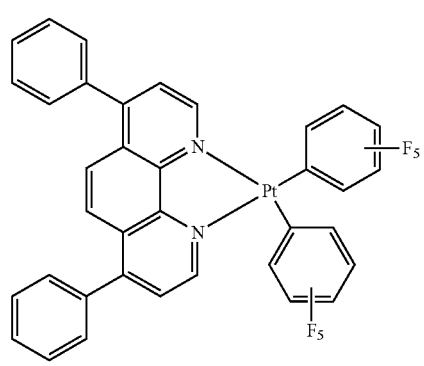 | Chem. Lett. 34, 592 (2005) |
| | 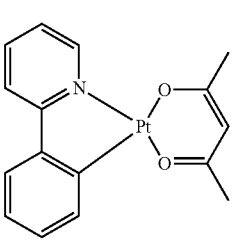 | WO2002015645 |
| | 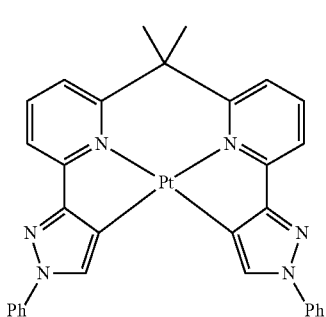 | US20060263635 |

TABLE XXX-continued

| MATERIAL | EXAMPLES OF MATERIAL | PUBLICATIONS |
| --- | --- | --- |
| Cu complexes | | WO2009000673 |
| Gold complexes | | Chem. Commun. 2906 (2005) |
| Rhenium (III) complexes | | Inorg. Chem. 42, 1248 (2003) |
| Deuterated organometallic complexes | | US20030138657 |

TABLE XXX-continued
| MATERIAL | EXAMPLES OF MATERIAL | PUBLICATIONS |
|---|---|---|
| Organometallic complexes with two or more metal centers | 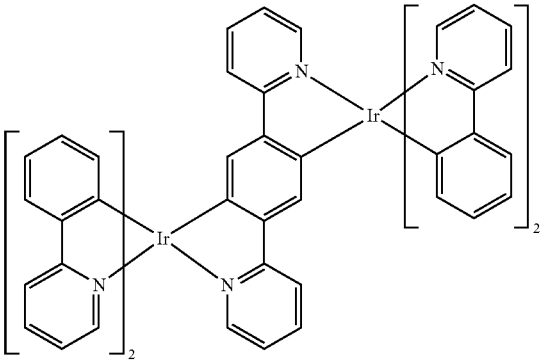 | US20030152802 |
| | 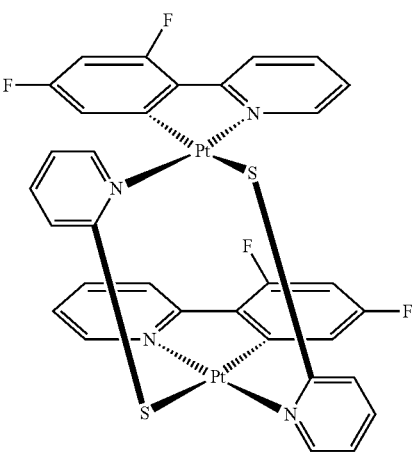 | U.S. Pat. No. 7,090,928 |
| Blue dopants | | |
| Iridium (III) organometallic complexes | 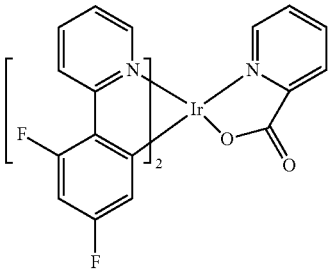 | WO2002002714 |
| | 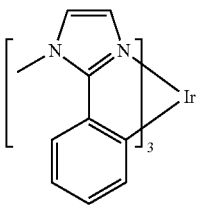 | WO2006009024 |
| | 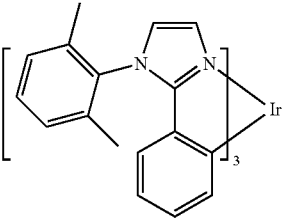 | US20060251923 |

TABLE XXX-continued

| MATERIAL | EXAMPLES OF MATERIAL | PUBLICATIONS |
|---|---|---|
| | | U.S. Pat. No. 7,393,599, WO2006056418, US20050260441, WO2005019373 |
| | | U.S. Pat. No. 7,534,505 |
| | | U.S. Pat. No. 7,445,855 |
| | | US20070190359, US20080297033 |
| | | U.S. Pat. No. 7,338,722 |
| | | US20020134984 |

TABLE XXX-continued

| MATERIAL | EXAMPLES OF MATERIAL | PUBLICATIONS |
|---|---|---|
| | | Angew. Chem. Int. Ed. 47, 1 (2008) |
| | | Chem. Mater. 18, 5119 (2006) |
| | | Inorg. Chem. 46, 4308 (2007) |
| | | WO2005123873 |
| | | WO2005123873 |
| | | WO2007004380 |

TABLE XXX-continued
| MATERIAL | EXAMPLES OF MATERIAL | PUBLICATIONS |
|---|---|---|
| | 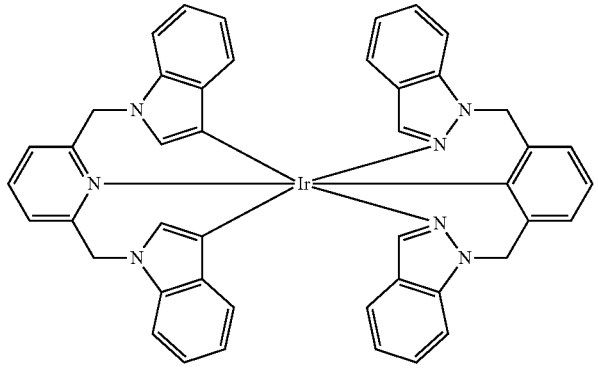 | WO2006082742 |
| Osmium (II) complexes | 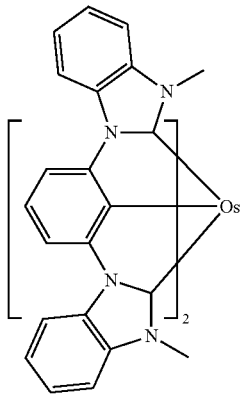 | U.S. Pat. No. 7,279,704 |
| | 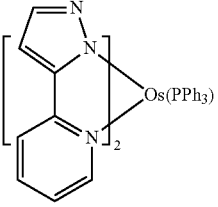 | Organometallics 23, 3745 (2004) |
| Gold complexes | 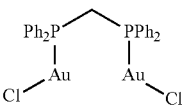 | Appl. Phys. Lett. 74, 1361 (1999) |
| Platinum (II) complexes | 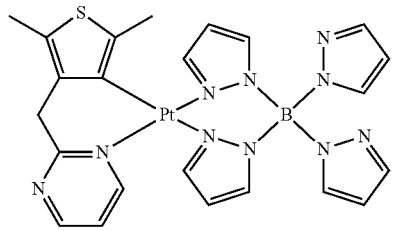 | WO2006098120, WO2006103874 |

TABLE XXX-continued

| MATERIAL | EXAMPLES OF MATERIAL | PUBLICATIONS |
|---|---|---|
| Exciton/hole blocking layer materials | | |
| Bathocuprine compounds (e.g., BCP, BPhen) | 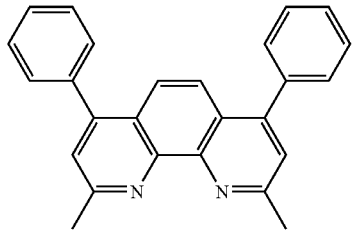 [SMILES: Cc1cc(-c2ccccc2)c2ccc3c(-c4ccccc4)cc(C)nc3c2n1] | Appl. Phys. Lett. 75, 4 (1999) |
| | 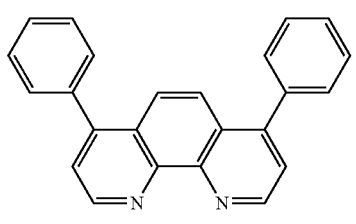 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 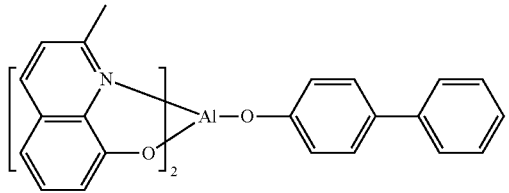 | Appl. Phys. Lett. 81, 162 (2002) |
| 5-member ring electron deficient heterocycles such as triazole, oxadiazole, imidazole, benzoimidazole | 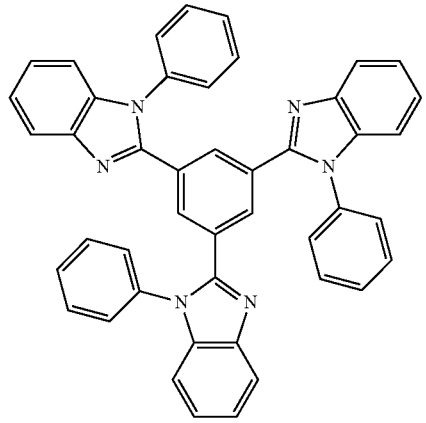 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |
| Triphenylene compounds | 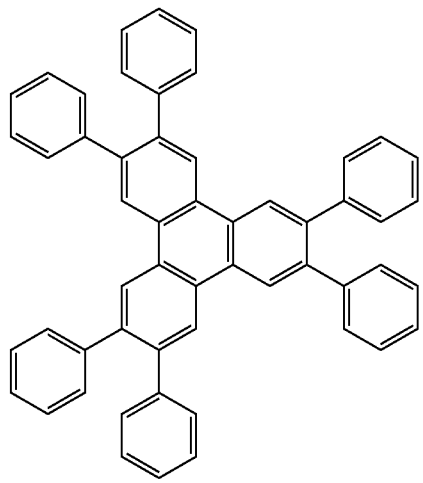 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |

TABLE XXX-continued
| MATERIAL | EXAMPLES OF MATERIAL | PUBLICATIONS |
|---|---|---|
| Fluorinated aromatic compounds | 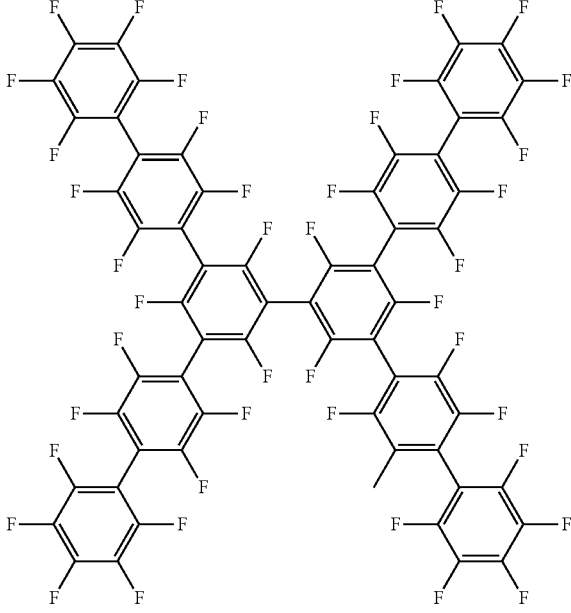 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 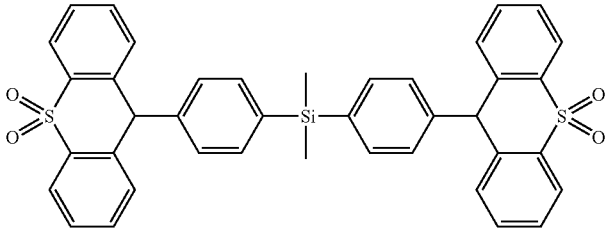 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
Electron transporting materials
| | | |
|---|---|---|
| Anthracene-benzoimidazole compounds | 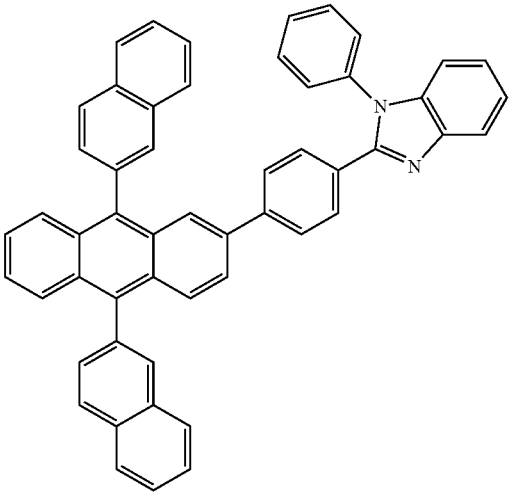 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |

TABLE XXX-continued

| MATERIAL | EXAMPLES OF MATERIAL | PUBLICATIONS |
|---|---|---|
| | | US20090179554 |
| Aza triphenylene derivatives | | US20090115316 |
| Anthracene-benzothiazole compounds | | Appl. Phys. Lett. 89, 063504 (2006) |
| Metal 8-hydroxyquinolates (e.g., Alq$_3$, Zrq$_4$) | | Appl. Phys. Lett. 51, 913 (1987) U.S. Pat. No. 7,230,107 |
| Metal hydroxy-benoquinolates | | Chem. Lett. 5, 905 (1993) |
| Bathocuprine compounds such as BCP, BPhen, etc | | Appl. Phys. Lett. 91, 263503 (2007) |

TABLE XXX-continued

| MATERIAL | EXAMPLES OF MATERIAL | PUBLICATIONS |
|---|---|---|
| | | Appl. Phys. Lett. 79, 449 (2001) |
| 5-member ring electron deficient heterocycles (e.g., triazole, oxadiazole, imidazole, benzoimidazole) | | Appl. Phys. Lett. 74, 865 (1999) |
| | | Appl. Phys. Lett. 55, 1489 (1989) |
| | | Jpn. J. Apply. Phys. 32, L917 (1993) |
| Silole compounds | | Org. Electron. 4, 113 (2003) |
| Arylborane compounds | | J. Am. Chem. Soc. 120, 9714 (1998) |

TABLE XXX-continued

| MATERIAL | EXAMPLES OF MATERIAL | PUBLICATIONS |
| --- | --- | --- |
| Fluorinated aromatic compounds | | J. Am. Chem. Soc. 122, 1832 (2000) |
| Fullerene (e.g., C60) | | US20090101870 |
| Triazine complexes | | US20040036077 |
| Zn (N^N) complexes | | U.S. Pat. No. 6,528,187 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:
1. A light emitting panel comprising:
a first electrode layer;
an organic layer stack over the first electrode layer;
a second electrode layer over the organic layer stack; and
a plurality of bus lines in electrical contact with at least one of the first electrode layer and the second electrode layer;
wherein, the plurality of bus lines are deposited by vapor deposition and include a final profile shape as deposited.

2. The panel of claim 1, wherein the plurality of bus lines are in electrical contact with the first electrode layer and the first electrode layer is deposited before the plurality of bus lines.

3. The panel of claim 1, wherein the plurality of bus lines are in electrical contact with the first electrode layer and the plurality of bus lines are deposited before first electrode layer.

4. The panel of claim 1, wherein the organic layer stack is on the bus lines without an interceding insulator.

5. The panel of claim 1, further comprising an insulator between the organic layer stack and the bus lines.

6. The panel of claim 5, wherein the insulator is formed without breaking a vacuum formed during the patterning of the bus lines by vapor deposition.

7. The panel of claim 6, wherein the final profile shape of the insulating layer corresponds to a profile shape of the insulating layer as deposited.

8. The panel of claim 1, wherein a slope angle of a sidewall of the bus line layer is in a range of 0.01°-30°.

9. The panel of claim 8, wherein the maximum absolute value of the second derivative of the sidewall pro tile of the bus line layer is <1.0.

10. The panel of claim 8, wherein a RMS surface roughness of the bus line layer along the sidewall profile is <30 nm.

11. The panel of claim 1, wherein the plurality of bus lines are in electrical contact with the second electrode layer and the second electrode layer is deposited before the plurality of bus lines.

12. The panel of claim 1, wherein the plurality of bus lines are in electrical contact with the second electrode layer and the plurality of bus lines are deposited before the second electrode layer.

13. The panel of claim 1, wherein a first set of the plurality of bus lines are in electrical contact with the first electrode layer and a second set of the plurality of bus lines are in electrical contact with the second electrode layer.

14. The panel of claim 1, wherein the bus lines are patterned by vapor deposition through a shadow mask, including at least one of vacuum thermal evaporation (VTE) deposition, sputter deposition, e-beam evaporation and chemical vapor deposition (CVD).

15. A light emitting panel comprising:
a first electrode layer;
an organic layer stack over the first electrode layer;
a second electrode layer over the organic layer stack; and
a plurality of bus lines in electrical contact with at least one of the first electrode layer and the second electrode layer,
wherein, the plurality of bus lines include a final profile shape having sidewall angles in a range approximately between 0.01°-30°.

16. The panel of claim 15, wherein the sidewall angle is measured based on a line between two points on the sidewall slope at 10% and 90% respectively of bus line thickness.

17. The panel of claim 16, wherein the final profile shape has sidewall angles in a range approximately between 0.01°-20°.

18. The panel of claim 16, wherein the final profile shape has sidewall angles in a range approximately between 0.01°-10°.

19. The panel of claim 16, wherein the final profile shape has sidewall angles in a range approximately between 0.01°-1°.

20. The panel of claim 15, wherein the maximum absolute value of the second derivative of the sidewall of the bus line layer is <1.0.

21. The panel of claim 15, wherein a RMS surface roughness of the bus line layer along a sidewall is <30 nm.

22. The panel of claim 15, wherein the organic layer stack is on the bus lines without an interceding insulator.

23. The panel of claim 15, further comprising an insulator between the organic layer stack and the bus lines.

24. The panel of claim 23, wherein the insulator is formed without breaking a vacuum formed during patterning of the bus lines by vapor deposition.

25. The panel of claim 24, wherein the final profile shape of the insulating layer corresponds to a profile shape of the insulating layer as deposited.

* * * * *